United States Patent [19]
Shibutani et al.

[11] Patent Number: 5,841,690
[45] Date of Patent: Nov. 24, 1998

[54] SEMICONDUCTOR MEMORY

[75] Inventors: Koji Shibutani; Hideshi Maeno, both of Tokyo, Japan

[73] Assignee: Mitsubishi Denki Kabushiki Kaisha, Tokyo, Japan

[21] Appl. No.: 908,587

[22] Filed: Aug. 8, 1997

Related U.S. Application Data

[63] Continuation of Ser. No. 644,068, May 9, 1996, abandoned.

[30] Foreign Application Priority Data

Dec. 12, 1995 [JP] Japan ................................. 7-323149

[51] Int. Cl.$^6$ ....................................................... G11C 7/00
[52] U.S. Cl. ........................... 365/149; 365/187; 365/150
[58] Field of Search ................................... 365/149, 187, 365/188, 174, 150

[56] References Cited

U.S. PATENT DOCUMENTS

| | | | |
|---|---|---|---|
| 4,308,594 | 12/1981 | Jiang | 365/149 |
| 4,534,017 | 8/1985 | Thomas et al. | 365/149 |
| 4,935,896 | 6/1990 | Matsumura et al. | 365/187 |
| 5,377,142 | 12/1994 | Matsumura et al. | 365/149 |

FOREIGN PATENT DOCUMENTS 60-95963  5/1985  Japan .

*Primary Examiner*—Vu A. Le
*Attorney, Agent, or Firm*—Oblon, Spivak, McClelland, Maier & Neustadt, P.C.

[57] ABSTRACT

A semiconductor memory in which integration is enhanced is provided. An NMOS transistor Qn1 has a gate connected to a write word line WWLn, a source connected to a write bit line WBLn, and a drain connected to a node N1. An NMOS transistor Qn2 has a gate connected to a read word line RWLn and a source connected to a read bit line RBLn. An NMOS transistor Qn3 has a gate connected to the drain of the NMOS transistor Qn1, a source connected to a ground level, and a drain connected to the drain of the NMOS transistor Qn2. An NMOS transistor Qn4 has a gate connected to a ground level, a source connected to the source of the NMOS transistor Qn3, and a drain connected to the drain of the NMOS transistor Qn1. The NMOS transistor Qn4 is kept off so that the drain of the NMOS transistor Qn1 is dielectrically isolated from the source of the NMOS transistor Qn3.

15 Claims, 24 Drawing Sheets

SEMICONDUCTOR MEMORY

This application is a Continuation of application Ser. No. 08/644,068, filed on May 9, 1996, now abandoned.

BACKGROUND OF THE INVENTION

1. Field of the Invention

The present invention relates to a semiconductor memory such as a memory contained in a LSI for picture processing.

2. Description of the Background Art

FIG. 28 is a circuit diagram showing the structure of a typical dynamic memory (DRAM (dynamic random access memory)) cell of a 3-element type which is used for a memory contained in a LSI for picture processing.

As shown in FIG. 28, an NMOS transistor Qn1 has a gate connected to a write word line WWL, a source connected to a write bit line WBL, and a drain connected to a node N1. An NMOS transistor Qn2 has a gate connected to a read word line RWL and a source connected to a read bit line RBL. An NMOS transistor Qn3 has a gate connected to the drain of the NMOS transistor Qn1 through the node N1, a source grounded, and a drain connected to the drain of the NMOS transistor Qn2.

A capacitor C1 is shown for convenience, but may be replaced with the drain-gate capacity of the NMOS transistor Qn1, the gate capacity of the NMOS transistor Qn3, the drain-gate capacity of the NMOS transistor Qn3, and the source-gate capacity of the NMOS transistor Qn3. More specifically, the NMOS transistors Qn1 to Qn3 form a 1-unit memory cell.

The writing and reading operation for the dynamic memory cell having the above structure will be described below.

According to the structure shown in FIG. 28, when executing the writing operation on the dynamic memory cell formed by the NMOS transistors, only the selected write word line WWL is set to the H level, the transistor Qn1 for writing is turned on, and the electric potential of the node N1 is defined by the electric potential of the write bit line WBL. If the electric potential of the write bit line WBL has the H level, the node N1 has the H level and "1" is written. If the electric potential of the write bit line WBL has the L level, the node N1 has the L level and "0" is written. The electric potential which is written is kept by setting the selected write word line WWL to the L level and turning off the transistor Qn1.

When executing the reading operation, the selected read word line RWL is set to the H level and the transistor Qn2 for reading is turned on. If "1" is kept, the node N1 has the H level. Since the NMOS transistors Qn2 and Qn3 are turned on, the electric potential of the read bit line RBL which is precharged is discharged and read out as the L level. If "0" is kept, the node N1 has the L level. For this reason, the transistor Qn3 is off so that the read bit line RBL and a ground potential are electrically interrupted. Consequently, the H level of the read bit line which is precharged is kept. Thus, it is known that the contents of the memory cell are "0".

FIG. 29 is a plan view showing an example of a layout in which the circuit shown in FIG. 28 is formed by using an NMOS transistor gate array.

As shown in FIG. 29, two gate portions 3 are provided in a 1-unit diffusion area 15. The diffusion areas 15 are dielectrically isolated by an oxide film 16. From the left of FIG. 29, three longitudinal first layer wirings 1 (shown by heavy slash hatching) are used for a ground potential GND, a write bit line WBL, and a read bit line RBL, respectively. Other first layer wirings 1 are used for the connection between first contacts 4, and the like. From the top of FIG. 29, two transverse second layer wirings 2 (shown by fine slash hatching) are used for a write word line WWL and a read word line RWL, respectively. The first contact 4 (shown by □) is used for the electric connection of the first layer wiring 1 to the gate portion 3 or diffusion area 15. A second contact 5 (shown by x in □) is used for the electric connection of the first layer wiring 1 to the second layer wiring 2. Beginning with the second gate portion 3 from the top of FIG. 29, NMOS transistors are provided in the order of Qn1, Qn3 and Qn2.

FIG. 30 is a circuit diagram in which two dynamic memory cells having the structure shown in FIG. 28 make a pair. FIG. 31 is a plan view showing an example of a layout in which the circuit shown in FIG. 30 is formed by using an NMOS transistor gate array.

As shown in FIG. 30, an NMOS transistor Qn1 has a gate connected to a write word line WWL0, a source connected to a write bit line WBL, and a drain connected to a node N1. An NMOS transistor Qn2 has a gate connected to a read word line RWL0 and a source connected to a read bit line RBL. An NMOS transistor Qn3 has a gate connected to the drain of the NMOS transistor Qn1 through the node N1, a source grounded, and a drain connected to the drain of the NMOS transistor Qn2.

An NMOS transistor Qn11 has a gate connected to a write word line WWL1, a source connected to the write bit line WBL, and a drain connected to a node N11. An NMOS transistor Qn12 has a gate connected to a read word line RWL1 and a source connected to the read bit line RBL. An NMOS transistor Qn13 has a gate connected to the drain of the NMOS transistor Qn11 through the node N11, a source grounded, and a drain connected to the drain of the NMOS transistor Qn12.

As shown in FIG. 31, two gate portions 3 are provided in a 1-unit diffusion area 15. The diffusion areas 15 are dielectrically isolated by an oxide film 16. From the top of FIG. 31, three transverse first layer wirings 1 are used for a read bit line RBL, a write bit line WBL, and a ground potential GND, respectively. Other first layer wirings 1 are used for the connection between first contacts 4, and the like. In FIG. 31, four longitudinal second layer wirings 2 are used for a write word line WWL0, a read word line RWL0, a write word line WWL1, and a read word line RWL1, respectively. The first contact 4 is used for the electric connection of the first layer wiring 1 to the gate portion 3 or diffusion area 15. A second contact 5 is used for the electric connection of the first layer wiring 1 to the second layer wiring 2. From the gate portion 3 on the left of FIG. 31, NMOS transistors are provided in the order of Qn1, Qn3, Qn2, Qn12, Qn13 and Qn11.

In the case where a dynamic memory according to the prior art is constructed by the gate array as shown in FIGS. 29 and 31, the transistors are dielectrically isolated by the oxide film 16. An area in which the oxide film 16 is formed should be provided so that the layout size is increased. Consequently, high integration cannot be obtained.

SUMMARY OF THE INVENTION

A first aspect of the present invention is directed to a semiconductor memory comprising a write word line, a write bit line, a read word line, a read bit line, a first transistor of a predetermined conductivity type having a control electrode connected to the write word line, a first electrode connected to the write bit line and a second electrode, a second transistor of the predetermined conductivity type having a control electrode connected to the read word line, a first electrode connected to the read bit line and a second electrode, a third transistor of the predetermined conductivity type having a control electrode connected to the second electrode of the first transistor, a first electrode for receiving a first control voltage, and a second electrode connected to the second electrode of the second transistor, and a fourth transistor of the predetermined conductivity type having a control electrode for receiving a second control voltage, a first electrode connected to the first electrode of the third transistor, and a second electrode connected to the second -electrode of the first transistor, wherein the second control voltage includes a voltage having the level at which the fourth transistor is turned off, and wherein the first to fourth transistors form a memory cell in which the control electrode of the third transistor is defined as a storage node.

A second aspect of the present invention is directed to the semiconductor memory further comprising a fifth transistor of the predetermined conductivity type having a control electrode for receiving a third control voltage, and first and second electrodes connected to the storage node of the memory cell, wherein the third control voltage may include a voltage having the level at which the fifth transistor is turned off, and wherein the first to fourth and fifth transistors may form the memory cell.

A third aspect of the present invention is directed to the semiconductor memory wherein the second control voltage may include a first voltage having the level at which the fourth transistor is turned off, and a second voltage having the level at which the fourth transistor is turned on.

A fourth aspect of the present invention is directed to the semiconductor memory wherein the first control voltage may include a first indicating voltage for indicating data "0" and a second indicating voltage for indicating data "1".

A fifth aspect of the present invention is directed to the semiconductor memory further comprising a second write word line and a second write bit line, wherein the first control voltage may be supplied from the second write bit line, and wherein the second control voltage may be supplied from the second write word line.

A sixth aspect of the present invention is directed to a semiconductor memory comprising first and second semiconductor storage portions which include the memory cell of the semiconductor memory according to the first aspect of the present invention respectively, wherein the memory cell of the first semiconductor storage portion is formed by an N type transistor of the basic cell of a CMOS gate array, and the memory cell of the second semiconductor storage portion is formed by a P type transistor of the basic cell of the CMOS gate array.

A seventh aspect of the present invention is directed to a semiconductor memory comprising a write word line, a write bit line, a read word line, a read bit line, a first transistor of a predetermined conductivity type having a control electrode connected to the write word line, a first electrode connected to the write bit line and a second electrode, a second transistor of the predetermined conductivity type having a control electrode connected to the read word line, a first electrode connected to the read bit line and a second electrode, a third transistor of the predetermined conductivity type having a control electrode connected to the second electrode of the first transistor, a first electrode connected to the write bit line, and a second electrode connected to the second electrode of the second transistor, and a fourth transistor of the predetermined conductivity type having a control electrode for receiving a control voltage, a first electrode connected to the second electrode of the first transistor and a second electrode, wherein the control voltage includes a voltage having the level at which the fourth transistor is turned off, and wherein the first to fourth transistors form a memory cell in which the control electrode of the third transistor is defined as a storage node.

An eighth aspect of the present invention is directed to a semiconductor memory comprising first and second semiconductor storage portions which include the memory cell of the semiconductor memory according to the seventh aspect of the present invention respectively, wherein the fourth transistor is shared by the first and second semiconductor storage portions.

A ninth aspect of the present invention is directed to a semiconductor memory comprising first and second semiconductor storage portions which include the memory cell of the semiconductor memory according to the seventh aspect of the present invention respectively, wherein the memory cell of the first semiconductor storage portion is formed by an N type transistor of the basic cell of a CMOS gate array, and the memory cell of the second semiconductor storage portion is formed by a P type transistor of the basic cell of the CMOS gate array.

According to the first aspect of the present invention as described above, the semiconductor memory comprises the fourth transistor of the predetermined conductivity type having a control electrode for receiving a second control voltage that includes a voltage having the level at which the fourth transistor itself is turned off, a first electrode connected to the first electrode of the third transistor, and a second electrode connected to the second electrode of the first transistor. Consequently, the fourth transistor is turned off by the second control voltage so that the second electrode of the first transistor can be dielectrically isolated from the first electrode of the third transistor without forming an insulating film.

As a result, the first, fourth and third transistors are sequentially formed adjacently without dielectric isolation and the fourth transistor is used for dielectric isolation so that the first transistor is dielectrically isolated from the third transistor. Thus, integration can be enhanced.

According to the second aspect of the present invention, the semiconductor memory further comprises the fifth transistor of the predetermined conductivity type having a control electrode for receiving a third control voltage, and first and second electrodes connected to the storage node of the memory cell.

Consequently, the first, fifth (fourth), fourth (fifth), and third transistors are sequentially formed adjacently without dielectric isolation and the fourth transistor is used for dielectric isolation so that the first transistor is dielectrically isolated from the third transistor. Thus, integration can be enhanced.

Furthermore, the first electrode—control electrode capacity and the second electrode—control electrode capacity of the fifth transistor can be added as the capacity which follows the storage node of the memory cell.

According to the third aspect of the present invention, the second control voltage includes a first voltage having the level at which the fourth transistor is turned off, and a second voltage having the level at which the fourth transistor is turned on. Consequently, the second voltage is applied as the second control voltage so that the storage node of the memory cell can be set to the first control voltage.

According to the fourth aspect of the present invention, the first control voltage includes a first indicator voltage for indicating data "0" and a second indicator voltage for indicating data "1". Consequently, the second voltage is applied as the second control voltage so that the electric potential of the storage node of the memory cell can be set to a voltage for indicating data "0" or "1".

According to the fifth aspect of the present invention, the first control voltage is supplied from the second write bit line and the second control voltage is supplied from the second write word line.

Accordingly, the first writing operation where the voltage having the level at which the first transistor is turned on is applied to the write word line to turn on the first transistor and the data present on the write bit line is given to the storage node of the memory cell, and the second writing operation where the voltage having the level at which the fourth transistor is turned on is applied to the second write word line to turn on the fourth transistor and the data present on the second write bit line is given to the storage node of the memory cell can be executed independently.

According to the sixth aspect of the present invention, the memory cell of the first semiconductor storage portion is formed by an N type transistor of the basic cell of a CMOS gate array, and the memory cell of the second semiconductor storage portion is formed by a P type transistor of the basic cell of the CMOS gate array. Consequently, the gate array having a CMOS structure can be utilized efficiently.

According to the seventh aspect of the present invention, the semiconductor memory comprises the fourth transistor of the predetermined conductivity type having a control electrode for receiving a control voltage that includes a voltage having the level at which the fourth transistor itself is turned off, and a second electrode connected to the second electrode of the first transistor. Consequently, the fourth transistor is turned off by the control voltage so that the second electrode can be set optionally.

According to the eighth aspect of the present invention, the fourth transistor is shared by the first and second semiconductor storage portions. If the fourth transistor is turned off by the control voltage, the first and second semiconductor storage portions do not interfere with each other. Thus, high integration can be obtained without hindrance to circuit operation.

According to the ninth aspect of the present invention, the memory cell of the first semiconductor storage portion is formed by an N type transistor of the basic cell of a CMOS gate array, and the memory cell of the second semiconductor storage portion is formed by a P type transistor of the basic cell of the CMOS gate array. Consequently, the gate array having a CMOS structure can be utilized efficiently.

It is an object of the present invention to provide a semiconductor memory in which integration is enhanced.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Embodiment>>
<Basic Structure (circuit diagram)>

Figure 1:
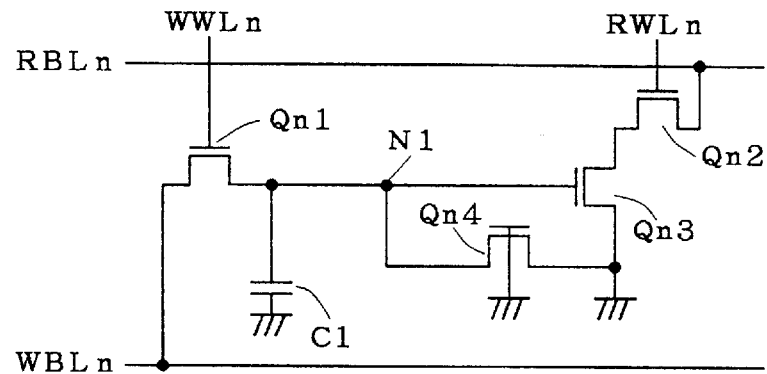
FIG. 1 is a circuit diagram showing the basic structure of a memory according to Embodiment 1 of the present invention.

FIG. 1 is a circuit diagram showing the structure of a dynamic (DRAM) memory cell according to a first embodiment which is used for a memory contained in a LSI for picture processing.

As shown in FIG. 1, an NMOS transistor Qn1 has a gate connected to a write word line WWLn, a source connected to a write bit line WBLn, and a drain connected to a node N1. An NMOS transistor Qn2 has a gate connected to a read word line RWLn and a source connected to a read bit line RBLn. An NMOS transistor Qn3 has a gate connected to the drain of the NMOS transistor Qn1 through the node N1, a source grounded, and a drain connected to the drain of the NMOS transistor Qn2. An NMOS transistor Qn4 has a gate grounded, a source connected to the source (ground level) of the NMOS transistor Qn3, and a drain connected to the drain of the NMOS transistor Qn1 through the node N1.

A capacitor C1 is shown for convenience, but may be replaced with the drain-gate capacity of the NMOS transistor Qn1, the gate capacity of the NMOS transistor Qn3, the drain-gate capacity of the NMOS transistor Qn3, the source-gate capacity of the NMOS transistor Qn3, and the drain-gate capacity of the NMOS transistor Qn4. More specifically, the NMOS transistors Qn1 to Qn4 form a 1-unit memory cell. The writing and reading operation for the dynamic memory cell having the above structure according to the first embodiment will be described below.

According to the structure shown in FIG. 1, when executing the writing operation on the dynamic memory cell formed by the NMOS transistors, only the selected write word line WWLn is set to the H level, the transistor Qn1 for writing is turned on, and the electric potential of the node N1 is defined by the electric potential of the write bit line WBLn. If the electric potential of the write bit line WBLn has the H level, the node N1 has the H level and "1" is written. If the electric potential of the write bit line WBLn has the L level, the node N1 has the L level and "0" is written. The electric potential which is written is kept by setting the selected write word line WWLn to the L level and turning off the transistor Qn1.

When executing the reading operation, the read bit line RBLn is precharged to the H level, the selected read word line RWLn is then set to the H level and the transistor Qn2 for reading is turned on. If "1" is kept, the node N1 has the H level. Since the NMOS transistors Qn2 and Qn3 are turned on, the electric potential of the read bit line RBLn which is precharged is discharged and read out as the L level ("1").

If "0" is kept, the node N1 has the L level. For this reason, the transistor Qn3 is off so that the read bit line RBLn and a ground potential are electrically interrupted. Consequently, the H level of the read bit line which is precharged is kept. Thus, it is known that the contents of the memory cell are "0".

In this case, the memory according to the first embodiment gives a ground level (a supply voltage having the L level) to the gate of the NMOS transistor Qn4 to keep the NMOS transistor Qn4 off. Consequently, the drain of the NMOS transistor Qn1 can be dielectrically isolated from the source of the NMOS transistor Qn3 without forming an insulating film.

<Basic Structure (layout pattern)>

Figure 2:
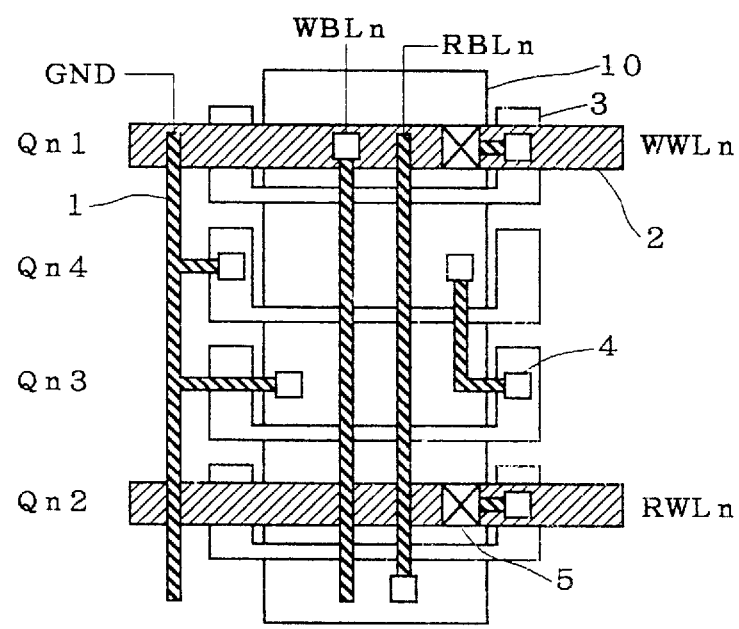
FIG. 2 is a plan view showing a layout pattern of FIG. 1 on a gate array.

FIG. 2 is a plan view showing a layout pattern in which the memory according to the first embodiment shown in FIG. 1 is formed by using a gate array for gate isolation.

As shown in FIG. 2, a diffusion area 10 in which transistors are not dielectrically isolated by an oxide film is provided for a plurality of (four in FIG. 2) gate portions 3 that are arranged in a line. From the left of FIG. 2, three longitudinal first layer wirings 1 (shown by heavy slash hatching) are used for a ground potential GND, a write bit line WBLn, and a read bit line RBLn, respectively. Other first layer wirings 1 are used for the connection between first contacts 4, and the like. From the top of FIG. 2, two transverse second layer wirings 2 (shown by fine slash hatching) are used for a write word line WWLn and a read word line RWLn, respectively. The first contact 4 (shown by □) is used for the electric connection of the first layer wiring 1 to the gate portion 3 or diffusion area 10. A second contact 5 (shown by x in □) is used for the electric connection of the first layer wiring 1 to the second layer wiring 2. From the top of FIG. 2, the gates of NMOS transistors are formed in the order of Qn1, Qn4, Qn3 and Qn2.

Thus, the NMOS transistors Qn1, Qn4, Qn3 and Qn2 are sequentially provided adjacently without dielectric isolation so as to form a memory cell. The NMOS transistor Qn4 is used for dielectric isolation so that the drain of the NMOS transistor Qn1 is dielectrically isolated from the source of the NMOS transistor Qn3 to enhance integration.

Figure 3:
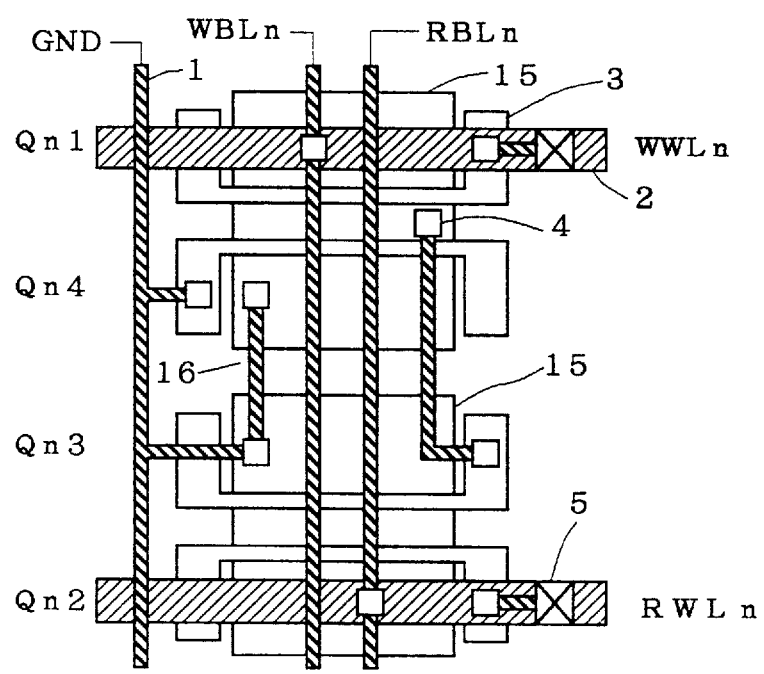
FIG. 3 is a plan view showing a layout pattern for explaining the effects of Embodiment 1.

FIG. 3 is a plan view showing a layout pattern in which the memory according to the first embodiment shown in FIG. 1 is formed by using a gate array for oxide isolation.

As shown in FIG. 3, two gate portions 3 are provided in a 1-unit diffusion area 15. The diffusion areas 15 are dielectrically isolated by an oxide film 16. From the left of FIG. 3, three longitudinal first layer wirings 1 are used for a ground potential GND, a write bit line WBLn, and a read bit line RBLn, respectively. Other first layer wirings 1 are used for the connection between first contacts 4, and the like. From the top of FIG. 3, two transverse second layer wirings 2 (shown by fine slash hatching) are used for a write word line WWLn and a read word line RWLn, respectively. The first contact 4 (shown by □) is used for the electric connection of the first layer wiring 1 to the gate portion 3 or diffusion area 15. A second contact 5 (shown by x in □) is used for the electric connection of the first layer wiring 1 to the second layer wiring 2. From the top of FIG. 3, the gates of NMOS transistors are formed in the order of Qn1, Qn4, Qn3 and Qn2.

Figure 29:
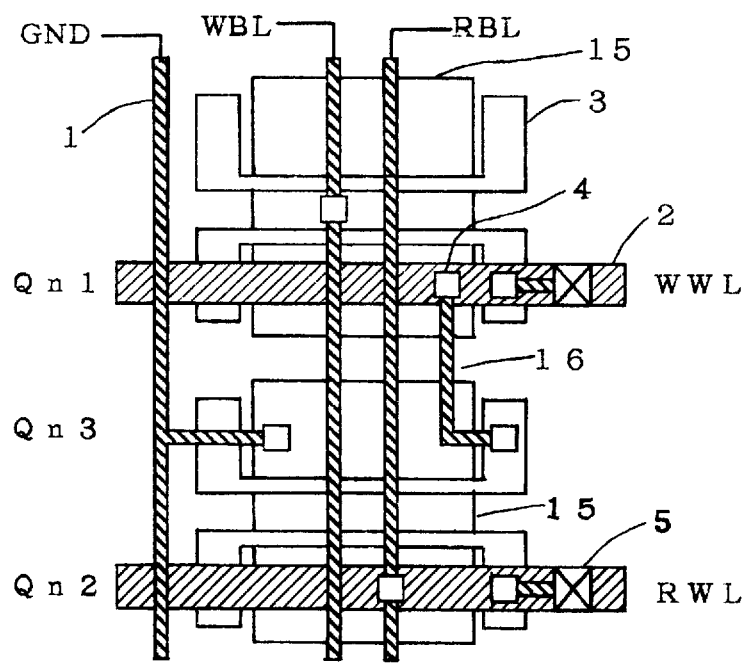
FIG. 29 is a plan view showing a layout pattern of FIG. 28 on a gate array.
Figure 30:
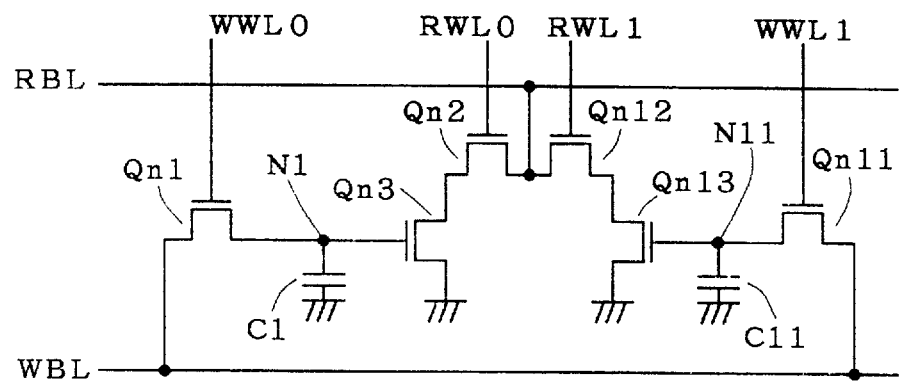
FIG. 30 is a circuit diagram showing the structure of a 2-unit memory cell in FIG. 28.
Figure 31:
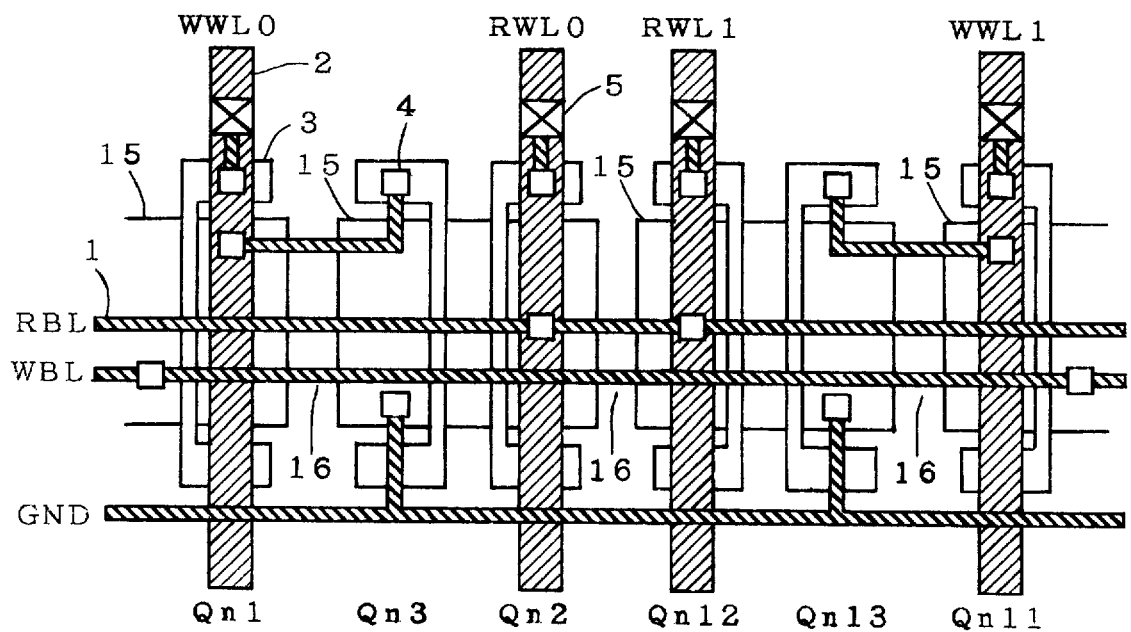
FIG. 31 is a plan view showing a layout pattern of FIG. 30 on a gate array.

By comparisons between FIG. 2 and FIG. 3 and between FIG. 2 and FIG. 29 (a layout pattern according to the prior art), it is proved that the layout pattern according to the first embodiment is formed with high integration because the oxide film 16 for dielectric isolation is not provided.

<CMOS Structure (circuit diagram)>

Figure 4:
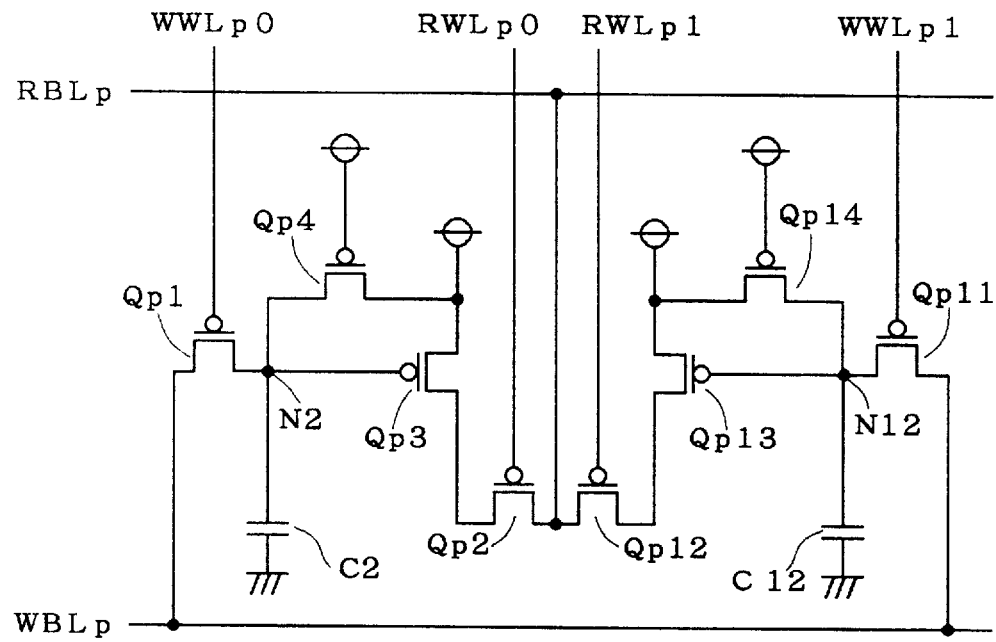
FIG. 4 is a circuit diagram showing the CMOS structure of the memory according to Embodiment 1.
Figure 4:
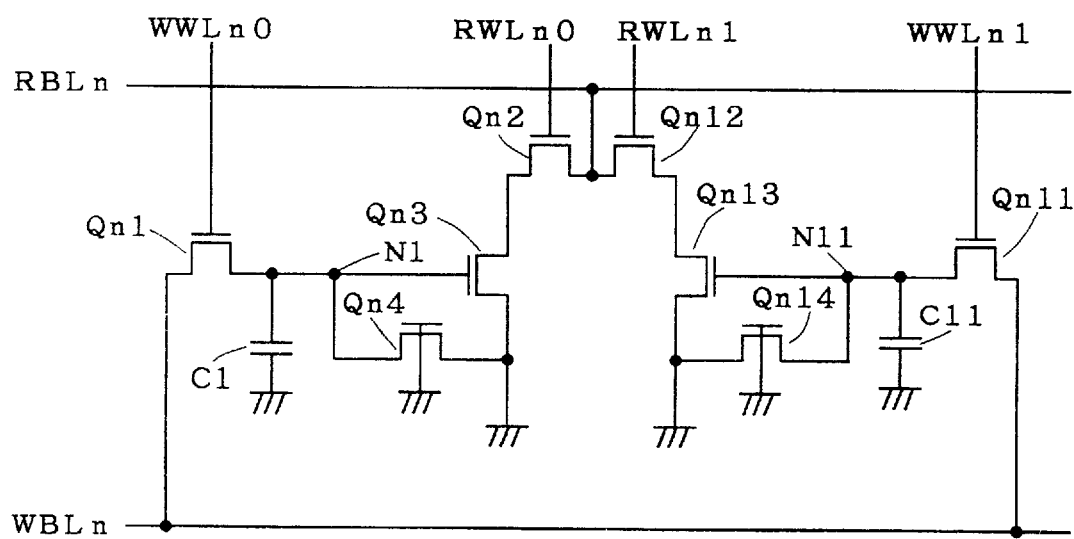

FIG. 4 is a circuit diagram showing the structure of a memory for a CMOS in which NMOS transistors and PMOS transistors each form two dynamic memory cells having the structure shown in FIG. 1.

As shown in FIG. 4, an NMOS transistor Qn1 has a gate connected to a write word line WWLn0, a source connected to a write bit line WBLn, and a drain connected to a node N1. An NMOS transistor Qn2 has a gate connected to a read word line RWLn0 and a source connected to a read bit line RBLn. An NMOS transistor Qn3 has a gate connected to the drain of the NMOS transistor Qn1 through the node N1, a source grounded, and a drain connected to the drain of the NMOS transistor Qn2. An NMOS transistor Qn4 has a gate grounded, a source connected to the source of the NMOS transistor Qn3, and a drain connected to the drain of the NMOS transistor Qn1 through the node N1. Thus, the NMOS transistors Qn1 to Qn4 form a 1-unit memory cell.

An NMOS transistor Qn11 has a gate connected to a write word line WWLn1, a source connected to a write bit line WBLn, and a drain connected to a node N11. An NMOS transistor Qn12 has a gate connected to a read word line RWLn1 and a source connected to the read bit line RBLn. An NMOS transistor Qn13 has a gate connected to the drain of the NMOS transistor Qn11 through the node N11, a source grounded, and a drain connected to the drain of the NMOS transistor Qn12. An NMOS transistor Qn14 has a gate grounded, a source connected to the source of the NMOS transistor Qn13, and a drain connected to the drain of the NMOS transistor Qn11 through the node N11. Thus, the NMOS transistors Qn11 to Qn14 form a 1-unit memory cell.

A PMOS transistor Qp1 has a gate connected to a write word line WWLp0, a source connected to a write bit line WBLp, and a drain connected to a node N2. A PMOS transistor Qp2 has a gate connected to a read word line RWLp0 and a source connected to a read bit line RBLp. A PMOS transistor Qp3 has a gate connected to the drain of the PMOS transistor Qp1 through the node N2, a source connected to a supply voltage VDD, and a drain connected to the drain of the PMOS transistor Qp2. A PMOS transistor Qp4 has a gate connected to a supply voltage VDD, a source connected to the source of the PMOS transistor Qp3, and a drain connected to the drain of the PMOS transistor Qp1 and the node N2. Thus, the PMOS transistors Qp1 to Qp4 form a 1-unit memory cell.

A PMOS transistor Qp11 has a gate connected to a write word line WWLp1, a source connected to a write bit line WBLp, and a drain connected to a node N12. A PMOS transistor Qp12 has a gate connected to a read word line RWLP1 and a source connected to the read bit line RBLp. A PMOS transistor Qp13 has a gate connected to the drain of the PMOS transistor Qp11 through the node N12, a source connected to a supply voltage VDD, and a drain connected to the drain of the PMOS transistor Qp12. A PMOS transistor Qp14 has a gate connected to a supply voltage VDD, a source connected to the source of the PMOS transistor Qp13, and a drain connected to the drain of the PMOS transistor Qp11 and the node N12. Thus, the PMOS transistors Qp11 to Qp14 form a 1-unit memory cell.

In the writing operation for the memory cell formed by the PMOS transistors, the write word line WWLp0 (WWLp1) is selectively set to the L level and the transistor Qp1 (Qp11) for writing is turned on. The subsequent operation is the same as that of the NMOS transistor.

The reading operation for the memory cell formed by the PMOS transistors is executed in the following manner. First of all, the read bit line RBLp is set to the L level. Then, the selected read word line RWLp0 (RWLP1) is set to the L level and the transistor Qp2 (Qp12) for reading is turned on. If "1" is kept, the node N2 has the H level. Since the PMOS transistor Qp3 (Qp13) is off, the read bit line RBLp keeps the L level. Thus, it is known that the contents of storage of the memory cell are "1".

If "0" is kept, the node N1 has the L level. For this reason, the transistors Qp2 (Qp12) and Qp3 (Qp13) are turned on so that the read bit line RBLp0 and the power source VDD are electrically connected to each other. Consequently, the preset L level of the read bit line is charged and read out as the H level ("0").

<CMOS Structure (layout pattern)>

Figure 5:
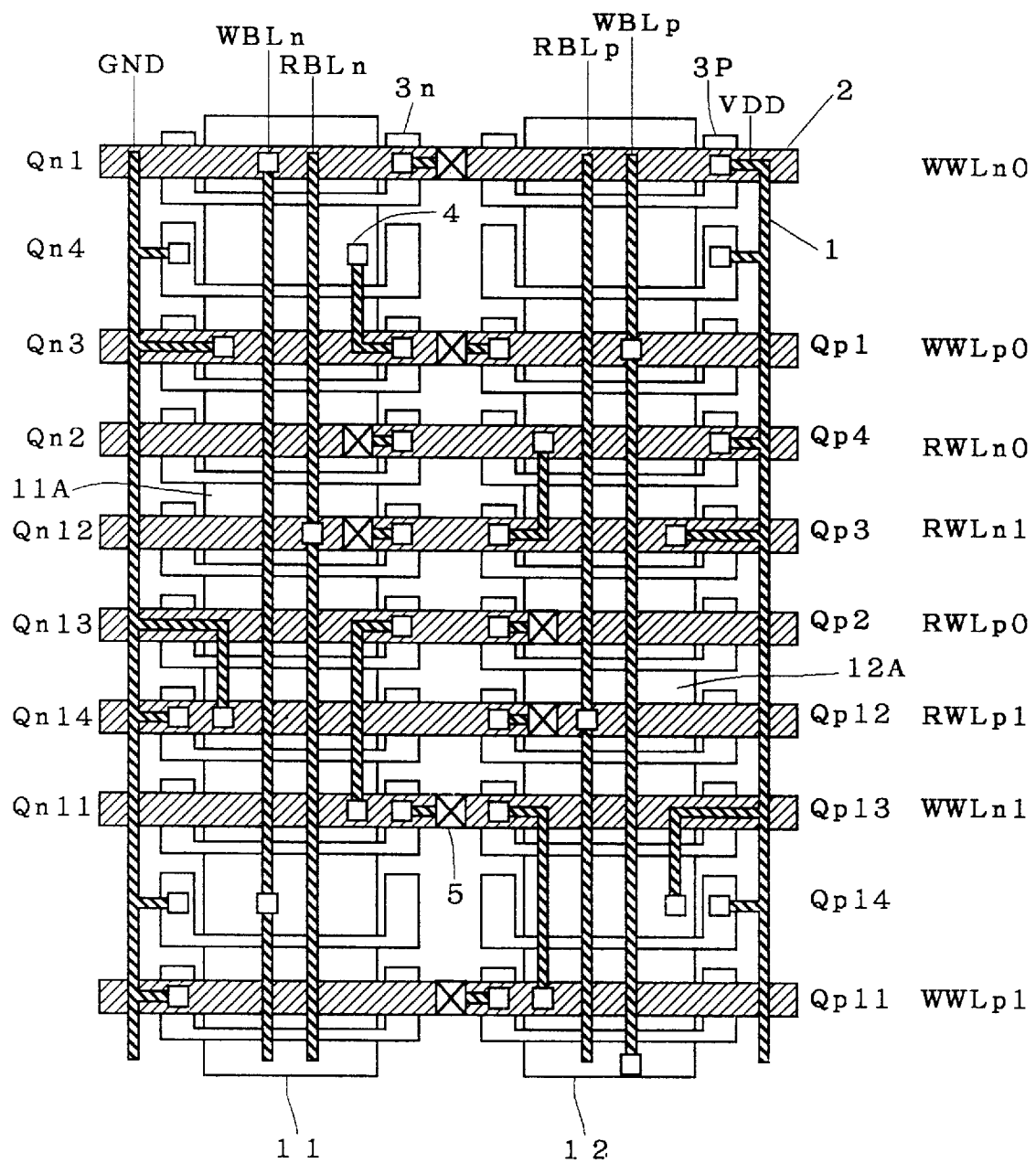
FIG. 5 is a plan view showing a layout pattern of FIG. 4 on a gate array.

FIG. 5 is a plan view showing a layout pattern in which the circuit shown in FIG. 4 is formed by using a gate array for a CMOS transistor. As shown in FIG. 5, an N type diffusion area 11 in which transistors are not dielectrically isolated by an oxide film is provided for gate portions 3n that are arranged in a line, and a P type diffusion area 12 in which transistors are not dielectrically isolated by an oxide film is provided for gate portions 3p that are arranged in a line.

From the left of FIG. 5, six longitudinal first layer wirings 1 are used for a ground potential GND, a write bit line WBLn, a read bit line RBLn, a read bit line RBLp, a write bit line WBLp, and a power source VDD, respectively. Other first layer wirings 1 are used for the connection between first contacts 4, and the like. From the top of FIG. 5, eight transverse second layer wirings 2 are used for a write word line WWLn0, a write word line WWLp0, a read word line RWLn0, a read word line RWLn1, a read word line RWLp0, a read word line RWLP1, a write word line WWLn1, and a write word line WWLp1, respectively. The first contact 4 is used for the electric connection of the first layer wiring 1 to the gate portions 3 (3n, 3p) or diffusion areas 11 and 12. A second contact 5 is used for the electric connection of the first layer wiring 1 to the second layer wiring 2.

From the gate portion 3n provided on the top of FIG. 5, NMOS transistors Qn1, Qn4, Qn3, Qn2, Qn12, Qn13, Qn14 and Qn11 are sequentially formed. Beginning with the third gate portion 3p from the top of FIG. 5, PMOS transistors Qp1, Qp4, Qp3, Qp2, Qp12, Qp13, Qp14 and Qp11 are sequentially formed.

Thus, a memory cell comprised of the NMOS transistors Qn1 to Qn4 is formed adjacently to a memory cell comprised of the NMOS transistors Qn11 to Qn14. Consequently, a diffusion area 11A can be shared as a source diffusion area between the NMOS transistor Qn2 which connects the read word line RWLn0 to the gate and the NMOS transistor Qn12 which connects the read word line RWLn1 to the gate. Similarly, a diffusion area 12A can be shared as a source diffusion area between the PMOS transistors Qp2 and Qp12 for reading. Thus, higher integration can be obtained.

In addition, a memory cell comprised of the NMOS transistors (Qn1 to Qn4, Qn11 to Qn14) and a memory cell comprised of the PMOS transistors (Qp1 to Qp4, Qp11 to Qp14) are formed together. Consequently, the gate array having a CMOS structure can be utilized efficiently.

While an example in which the source is shared by the transistors (Qn2, Qn12, Qp2, Qp12) for reading has been described in the first embodiment, the source is shared with the transistors (Qn1, Qn11, Qp1, Qp11) for writing formed adjacently on the same principle so that integration can be enhanced.

<<Second Embodiment>>
<Basic Structure (circuit diagram)>

Figure 6:
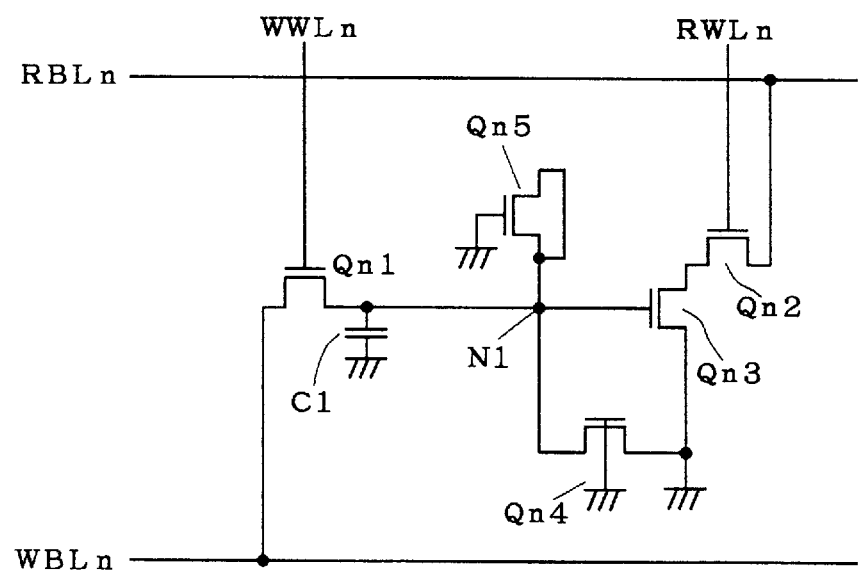
FIG. 6 is a circuit diagram showing the basic structure of a memory according to Embodiment 2 of the present invention.

FIG. 6 is a circuit diagram showing the structure of a dynamic memory cell according to a second embodiment which is used for a memory contained in a LSI for picture processing.

As shown in FIG. 6, an NMOS transistor Qn5 has a gate grounded, a source and a drain connected to the drain of an NMOS transistor Qn1 through a node N1.

A capacitor C1 is shown for convenience, but may be replaced with the drain-gate capacity of the NMOS transistor Qn1, the gate capacity of an NMOS transistor Qn3, the drain-gate capacity of the NMOS transistor Qn3, the source-gate capacity of the NMOS transistor Qn3, the drain-gate capacity of an NMOS transistor Qn4, the drain-gate capacity of the NMOS transistor Qn5, and the source-gate capacity of the NMOS transistor Qn5. More specifically, the NMOS transistors Qn1 to Qn5 form a 1-unit memory cell.

The writing and reading operation for the dynamic memory cell having the above structure according to the second embodiment is the same as that for the memory according to the first embodiment. Therefore, the description will be omitted.

Similarly to the first embodiment, the memory having the above basic structure according to the second embodiment gives a ground level (a supply voltage having the L level) to the gate of the NMOS transistor Qn4 to keep the NMOS transistor Qn4 off. Consequently, the drain of the NMOS transistor Qn1 can be dielectrically isolated from the source of the NMOS transistor Qn3 without forming an insulating film.

Similarly to the first embodiment, it is possible to obtain high integration because an oxide film for dielectric isolation is not formed.

In comparison with the first embodiment, the capacity of the capacitor C1 according to the second embodiment can exceed that of the capacitor C1 according to the first embodiment by the drain-gate and source-gate capacities of the NMOS transistor Qn5. Consequently, the capacity of storage of the memory cell can be increased.

<CMOS Structure (circuit diagram)>

Figure 7:
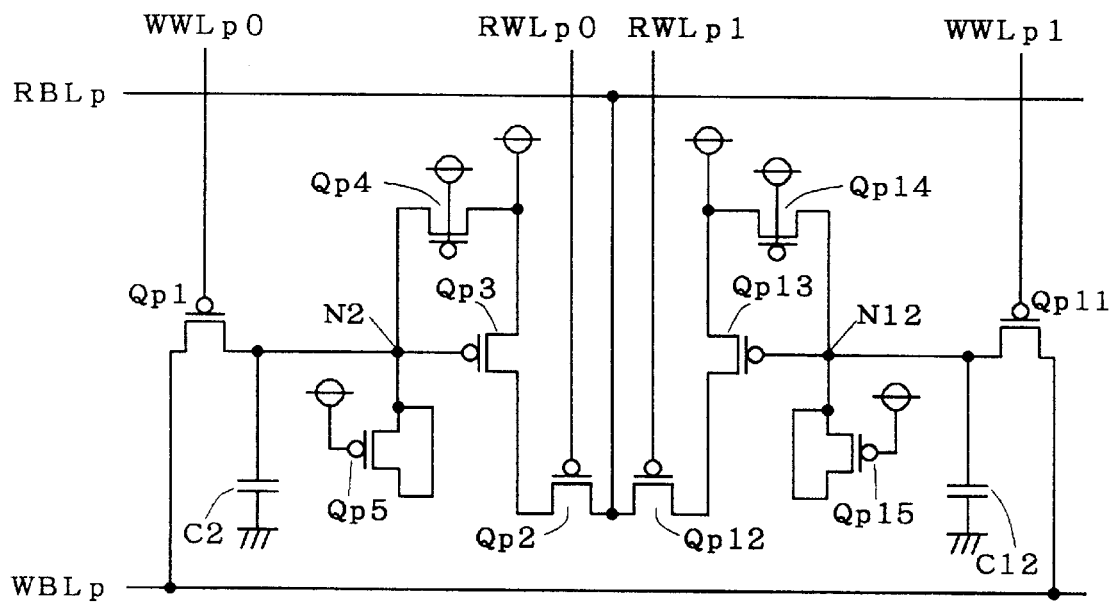
FIG. 7 is a circuit diagram showing the CMOS structure of the memory according to Embodiment 2.
Figure 7:
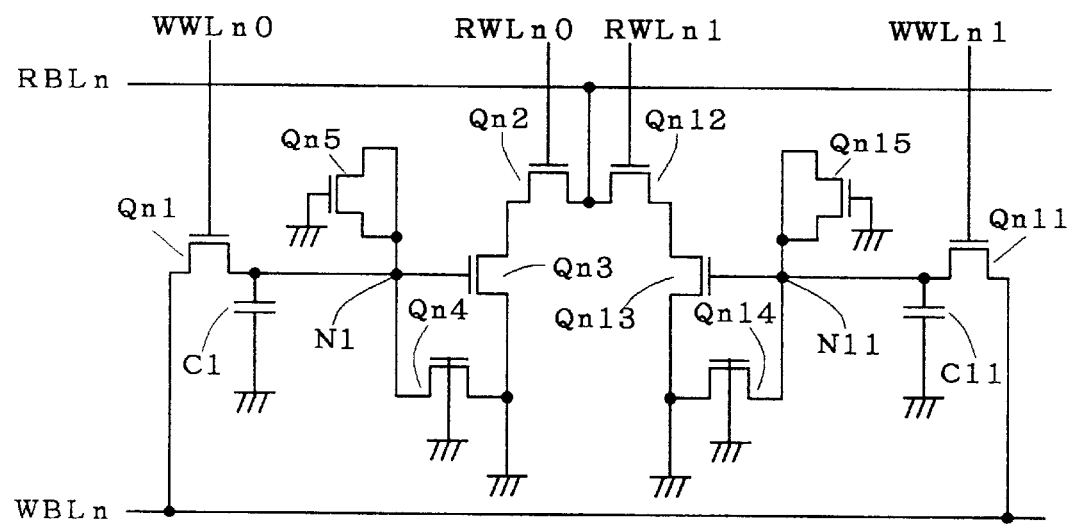

FIG. 7 is a circuit diagram showing the structure of a memory for a CMOS in which NMOS transistors and PMOS transistors each form two dynamic memory cells having the structure shown in FIG. 6. As shown in FIG. 7, an NMOS transistor Qn5 has a gate grounded, and a source and a drain connected to a node N1 in common. NMOS transistors Qn1 to Qn5 form a 1-unit memory cell. An NMOS transistor Qn15 has a gate grounded, and a source and a drain connected to a node N11 in common. NMOS transistors Qn11 to Qn15 form a 1-unit memory cell.

A PMOS transistor Qp5 has a gate connected to a supply voltage VDD, and a source and a drain connected to a node N2 in common. PMOS transistors Qp1 to Qp5 form a 1-unit memory cell. A PMOS transistor Qp15 has a gate connected to a supply voltage VDD, and a source and a drain connected to a node N12 in common. PMOS transistors Qp11 to Qp15 form a 1-unit memory cell.

Other structures are the same as in the first embodiment shown in FIG. 4. Therefore, the description will be omitted.

<CMOS Structure (layout pattern)>

Figure 8:
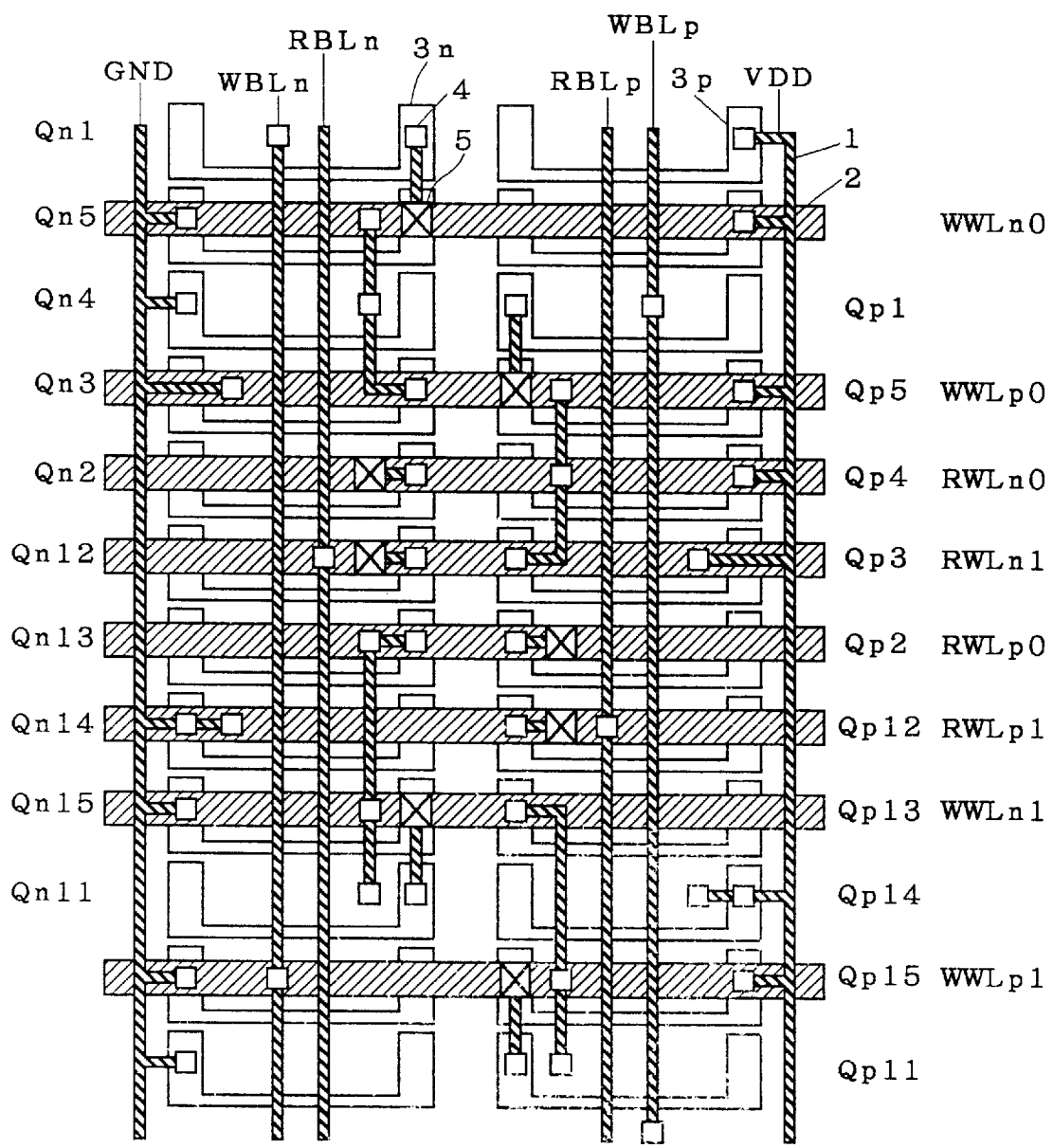
FIG. 8 is a plan view showing a layout pattern of FIG. 7 on a gate array.

FIG. 8 is a plan view showing a layout pattern in which the circuit shown in FIG. 7 is formed by using a gate array for a CMOS transistor. Similarly to the layout pattern according to the first embodiment shown in FIG. 5, an N type diffusion area where transistors are not dielectrically isolated by an oxide film is provided for gate portions 3n that are arranged in a line, and a P type diffusion area where transistors are not dielectrically isolated by an oxide film is provided for gate portions 3p that are arranged in a line, which are omitted in FIG. 8.

From the left of FIG. 8, six longitudinal first layer wirings 1 are used for a ground potential GND, a write bit line WBLn, a read bit line RBLn, a read bit line RBLp, a write bit line WBLp, and a power source VDD, respectively. Other first layer wirings 1 are used for the connection between first contacts 4, and the like.

From the top of FIG. 8, eight transverse second layer wirings 2 are used for a write word line WWLn0, a write word line WWLp0, a read word line RWLn0, a read word line RWLn1, a read word line RWLp0, a read word line RWLP1, a write word line WWLn1, and a write word line WWLp1, respectively. The first contact 4 is used for the electric connection of the first layer wiring 1 to the gate portions 3 (3n, 3p) or diffusion areas. A second contact 5 is used for the electric connection of the first layer wiring 1 to the second layer wiring 2.

From the gate portion 3n provided on the top of FIG. 8, NMOS transistors Qn1, Qn5, Qn4, Qn3, Qn2, Qn12, Qn13, Qn14, Qn15 and Qn11 are sequentially formed. Beginning with the third gate portion 3p from the top of FIG. 8, PMOS transistors Qp1, Qp5, Qp4, Qp3, Qp2, Qp12, Qp13, Qp14, Qp15 and Qp11 are sequentially formed.

Thus, a memory cell comprised of the NMOS transistors Qn1 to Qn5 is formed adjacently to a memory cell comprised of the NMOS transistors Qn11 to Qn15. Consequently, a diffusion area can be shared as a source diffusion area between the NMOS transistors Qn2 and Qn12 for reading in the same manner as in the first embodiment. Similarly, a diffusion area can be shared as a source diffusion area between the PMOS transistors Qp2 and Qp12. Accordingly, high integration can be obtained.

In addition, a memory cell comprised of the NMOS transistors (Qn1 to Qn5, Qn11 to Qn15) and a memory cell comprised of the PMOS transistors (Qp1 to Qp5, Qp11 to Qp15) are formed together. Consequently, the gate array having a CMOS structure can be utilized efficiently.

While an example in which the source is shared by the transistors (Qn2, Qn12, Qp2, Qp12) for reading has been described in the second embodiment, the source is shared with the transistors (Qn1, Qn11, Qp1, Qp11) for writing formed adjacently on the same principle so that integration can be enhanced.

<<Third Embodiment>>

<Basic Structure (circuit diagram)>

Figure 9:
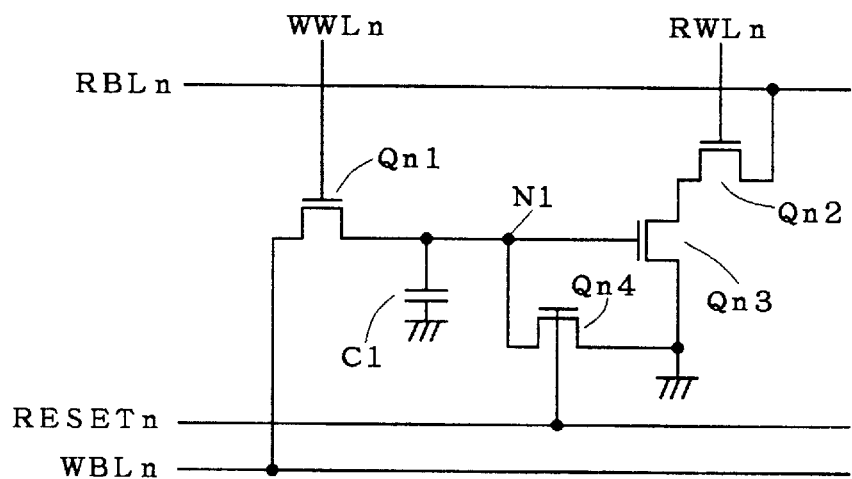
FIG. 9 is a circuit diagram showing the basic structure of a memory according to Embodiment 3 of the present invention.

FIG. 9 is a circuit diagram showing the structure of a dynamic memory cell according to a third embodiment which is used for a memory contained in a LSI for picture processing.

As shown in FIG. 9, an NMOS transistor Qn4 has a gate connected to a reset signal line RESETn. At the time of resetting, the H level (supply voltage level) is given to the reset signal line RESETn. For other periods, the L level (ground level) is given to the reset signal line RESETn. Other structures are the same as that of the first embodiment shown in FIG. 1.

The writing and reading operation for the dynamic memory cell having the above structure according to the third embodiment is the same as that for the memory according to the first embodiment. Therefore, the description will be omitted.

According to the memory having the above basic structure according to the third embodiment, the reset signal line RESETn is set to the L level and given to the gate of the NMOS transistor Qn4. The NMOS transistor Qn4 is kept off except a resetting period, so that the drain of an NMOS transistor Qn1 can be dielectrically isolated from the source of an NMOS transistor Qn3 without forming an insulating film.

Similarly to the first embodiment, it is possible to obtain high integration because an oxide film for dielectric isolation is not formed.

In addition, the reset signal line RESETn is set to the H level at the time of resetting so that the electric potential of a node N1 as a storage node can be initialized to the L level.

<CMOS Structure (circuit diagram)>

Figure 10:
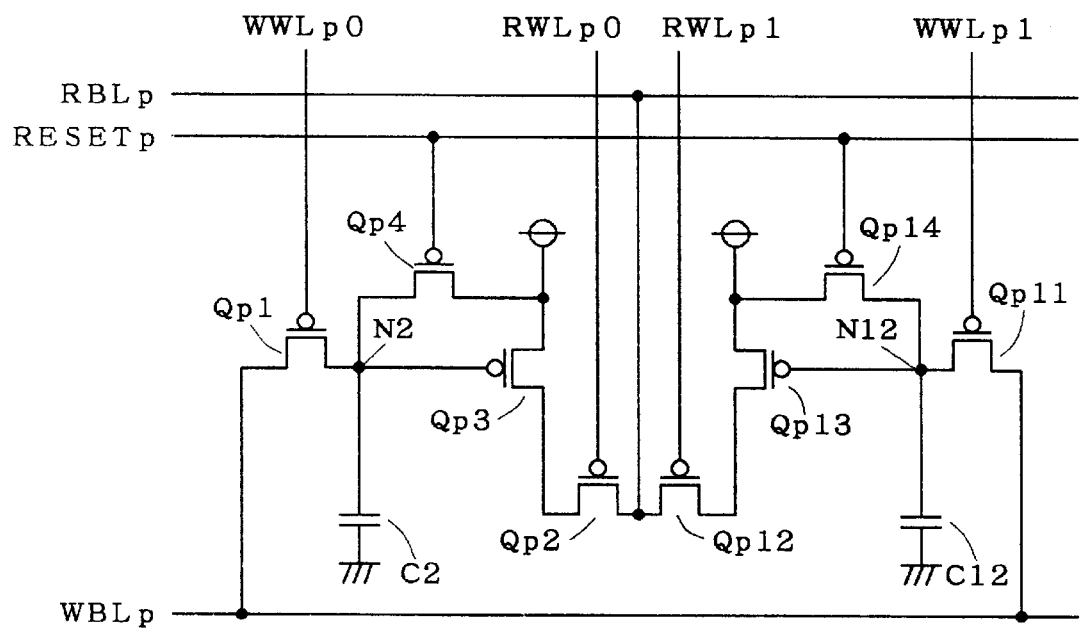
FIG. 10 is a circuit diagram showing the CMOS structure of the memory according to Embodiment 3.
Figure 10:
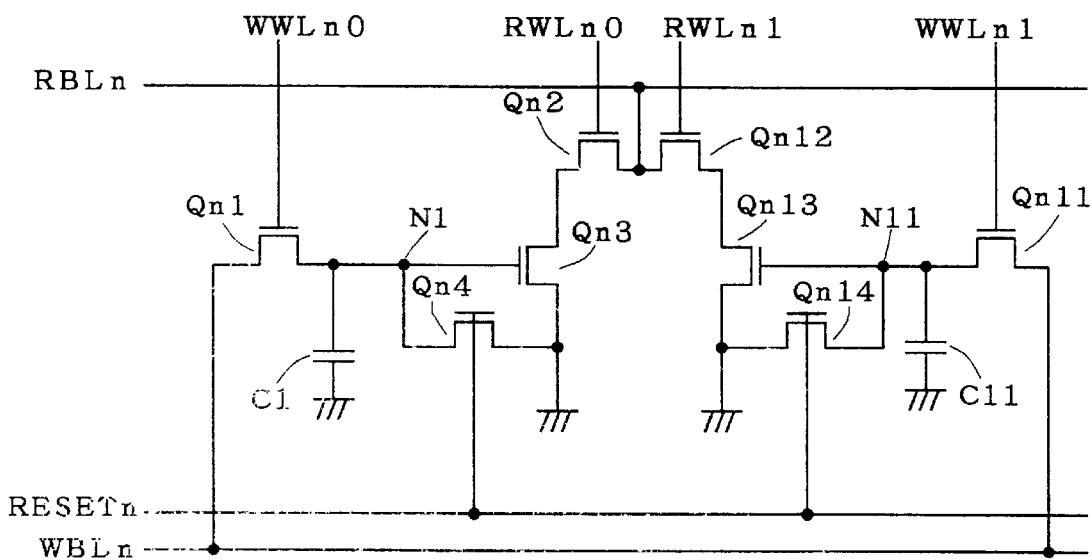

FIG. 10 is a circuit diagram showing the structure of a memory for a CMOS in which NMOS transistors and PMOS transistors each form two dynamic memory cells having the structure shown in FIG. 9.

As shown in FIG. 10, NMOS transistors Qn4 and Qn14 have gates connected to a reset signal line RESETn, and PMOS transistors Qp4 and Qp14 have gates connected to a reset signal line RESETp. At the time of resetting, the L level (ground level) is given to the reset signal line RESETp. For other periods, the H level (supply voltage level) is given to the reset signal line RESETp.

Accordingly, the reset signal line RESETn is set to the H level and the reset signal line RESETp is set to the L level at the time of resetting so that the electric potentials of nodes N1 and N11 as storage nodes can be initialized to the L level and the electric potentials of nodes N2 and N12 as storage nodes can be initialized to the H level. Other structures are the same as that of the first embodiment shown in FIG. 4. Therefore, the description will be omitted.

<CMOS Structure (layout pattern)>

Figure 11:
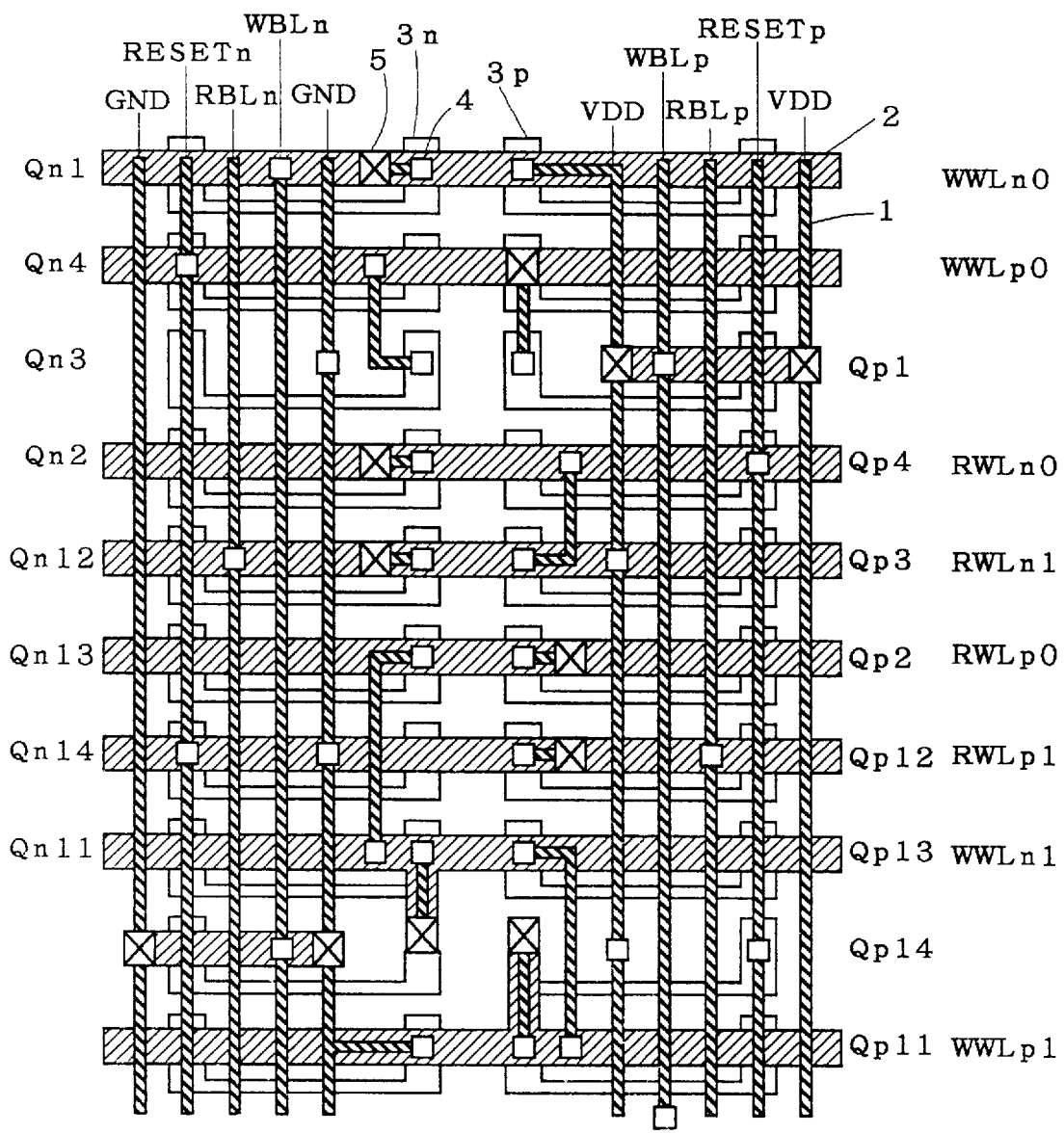
FIG. 11 is a plan view showing a layout pattern of FIG. 10 on a gate array.

FIG. 11 is a plan view showing a layout pattern in which the circuit shown in FIG. 10 is formed by using a gate array for a CMOS transistor. Similarly to the layout pattern according to the first embodiment shown in FIG. 5, an N type diffusion area where transistors are not dielectrically isolated by an oxide film is provided for gate portions 3n that are arranged in a line, and a P type diffusion area where transistors are not dielectrically isolated by an oxide film is provided for gate portions 3p that are arranged in a line, which are omitted in FIG. 11.

From the left of FIG. 11, ten longitudinal first layer wirings 1 are used for a ground potential GND, a reset signal line RESETn, a read bit line RBLn, a write bit line WBLn, a ground potential GND, a power source VDD, a write bit line WBLp, a read bit line RBLp, a reset signal line RESETp, and a power source VDD, respectively. Other first layer wirings 1 are used for the connection between first contacts 4, and the like.

From the top of FIG. 11, eight transverse second layer wirings 2 are used for a write word line WWLn0, a write word line WWLp0, a read word line RWLn0, a read word line RWLn1, a read word line RWLp0, a read word line RWLP1, a write word line WWLn1, and a write word line WWLp1, respectively. The first contact 4 is used for the electric connection of the first layer wiring 1 to the gate portions 3 (3n, 3p) or diffusion areas. A second contact 5 is used for the electric connection of the first layer wiring 1 to the second layer wiring 2.

From the gate portion 3n provided on the top of FIG. 11, NMOS transistors Qn1, Qn4, Qn3, Qn2, Qn12, Qn13, Qn14 and Qn11 are sequentially formed. Beginning with the third gate portion 3p from the top of FIG. 11, PMOS transistors Qp1, Qp4, Qp3, Qp2, Qp12, Qp13, Qp14 and Qp11 are sequentially formed.

Thus, a memory cell comprised of the NMOS transistors Qn1 to Qn4 is formed adjacently to a memory cell comprised of the NMOS transistors Qn11 to Qn14. Consequently, a diffusion area can be shared as a source diffusion area between the NMOS transistors Qn2 and Qn12 for reading in the same manner as in the first embodiment. Similarly, a diffusion area can be shared as a source diffusion area between the PMOS transistors Qp2 and Qp12. Accordingly, higher integration can be obtained.

In addition, a memory cell comprised of the NMOS transistors (Qn1 to Qn4, Qn11 to Qn14) and a memory cell comprised of the PMOS transistors (Qp1 to Qp4, Qp11 to Qp14) are formed together. Consequently, the gate array having a CMOS structure can be utilized efficiently.

While an example in which the source is shared by the transistors (Qn2, Qn12, Qp2, Qp12) for reading has been described in the third embodiment, the source is shared with the transistors (Qn1, Qn11, Qp1, Qp11) for writing formed adjacently on the same principle so that integration can be enhanced.

<<Fourth Embodiment>>

<Basic Structure (circuit diagram)>

Figure 12:
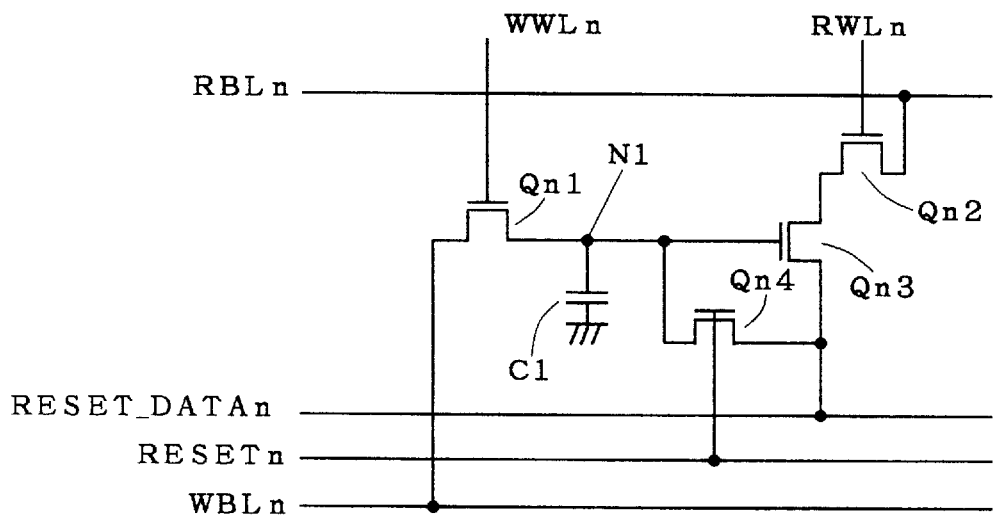
FIG. 12 is a circuit diagram showing the basic structure of a memory according to Embodiment 4 of the present invention.

FIG. 12 is a circuit diagram showing the structure of a dynamic memory cell according to a fourth embodiment which is used for a memory contained in a LSI for picture processing.

As shown in FIG. 12, an NMOS transistor Qn4 has a gate connected to a reset signal line RESETn. The sources of the NMOS transistors Qn3 and Qn4 are connected to a reset data signal line RESET$_{13}$ DATAn.

At the time of resetting, the H level (supply voltage level) is given to the reset signal line RESETn. For other periods, the L level (ground level) is given to the reset signal line RESETn. The H or L level is selectively given to the reset data signal line RESET_DATAn from the outside. Other structures are the same as that of the first embodiment shown in FIG. 1.

The writing and reading operation for the dynamic memory cell having the above structure according to the fourth embodiment is the same as that for the memory according to the first embodiment. Therefore, the description will be omitted.

According to the memory having the above basic structure according to the fourth embodiment, the reset signal line RESETn is set to the L level and given to the gate of the NMOS transistor Qn4 similarly to the third embodiment. The NMOS transistor Qn4 is kept off except a resetting period, so that the drain of an NMOS transistor Qn1 can be dielectrically isolated from the source of the NMOS transistor Qn3 without forming an insulating film.

Similarly to the first embodiment, it is possible to obtain high integration because an oxide film for dielectric isolation is not formed.

In addition, the reset signal line RESETn is set to the H level at the time of resetting so that the electric potential of a node N1 as a storage node can be initialized to the level obtained by the reset data signal line RESET_DATAn.

<CMOS Structure (circuit diagram)>

Figure 13:
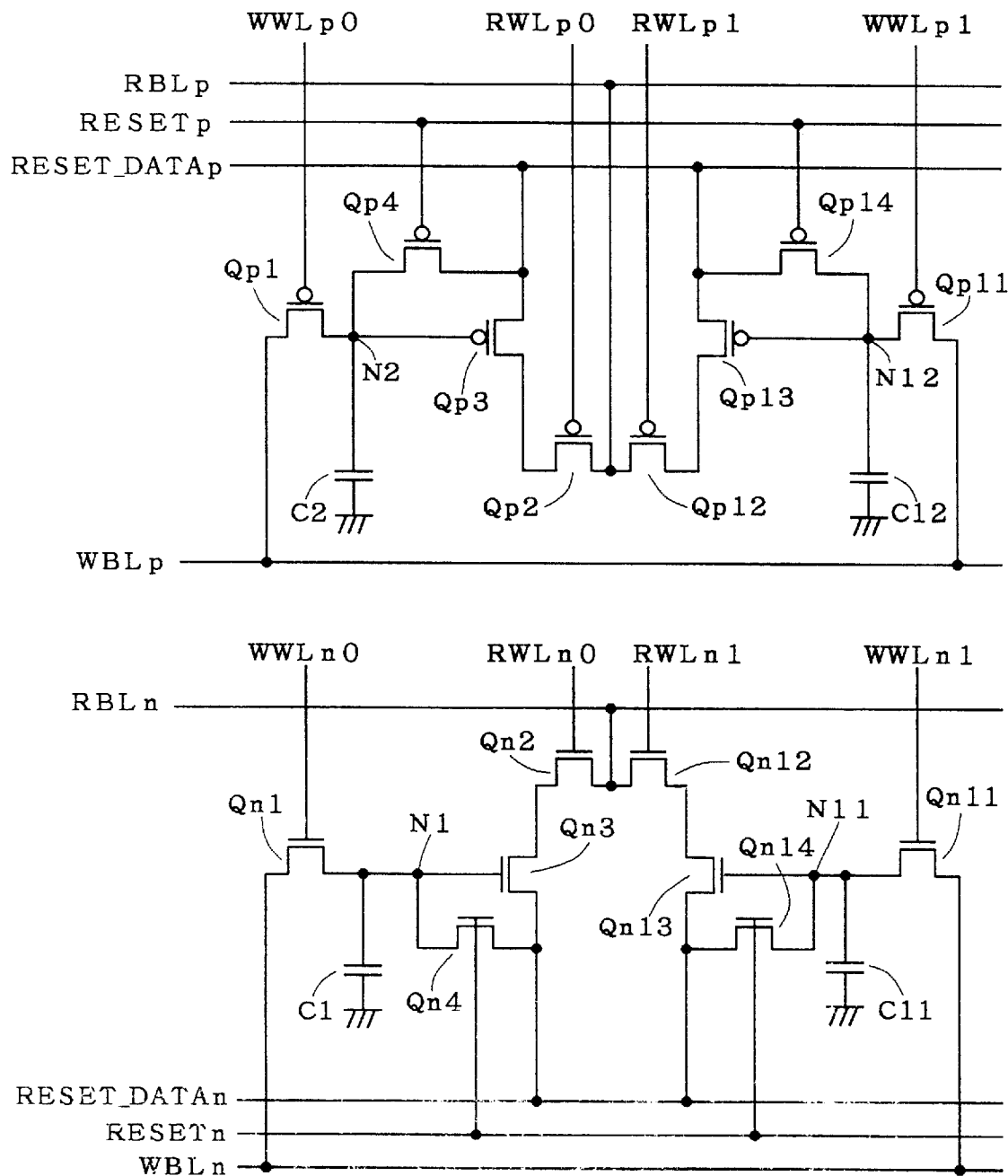
FIG. 13 is a circuit diagram showing the CMOS structure of the memory according to Embodiment 4.

FIG. 13 is a circuit diagram showing the structure of a memory for a CMOS in which NMOS transistors and PMOS transistors each form two dynamic memory cells having the structure shown in FIG. 12.

As shown in FIG. 13, NMOS transistors Qn4 and Qn14 have gates connected to a reset signal line RESETn, and PMOS transistors Qp4 and Qp14 have gates connected to a reset signal line RESETp. At the time of resetting, the L level (ground level) is given to the reset signal line RESETp. For other periods, the H level (supply voltage level) is given to the reset signal line RESETp.

The sources of NMOS transistors Qn3 and Qn13 and those of the NMOS transistors Qn4 and Qn14 are connected to a reset data signal line RESET_DATAn. The sources of PMOS transistors Qp3 and Qp13 and those of the PMOS transistors Qp4 and Qp14 are connected to a reset data signal line RESET_DATAp. The H or L level is selectively given to the reset data signal line RESET_DATAp from the outside.

Accordingly, the reset signal line RESETn is set to the H level and the reset signal line RESETp is set to the L level at the time of resetting so that the electric potentials of nodes N1 and N11 as storage nodes can be initialized to the level obtained by the reset data signal line RESET_DATAn and the electric potentials of nodes N2 and N12 as storage nodes can be initialized to the level obtained by the reset data signal line RESET_DATAp. Other structures are the same as that of the first embodiment shown in FIG. 4. Therefore, the description will be omitted.

<CMOS Structure (layout pattern)>

Figure 14:
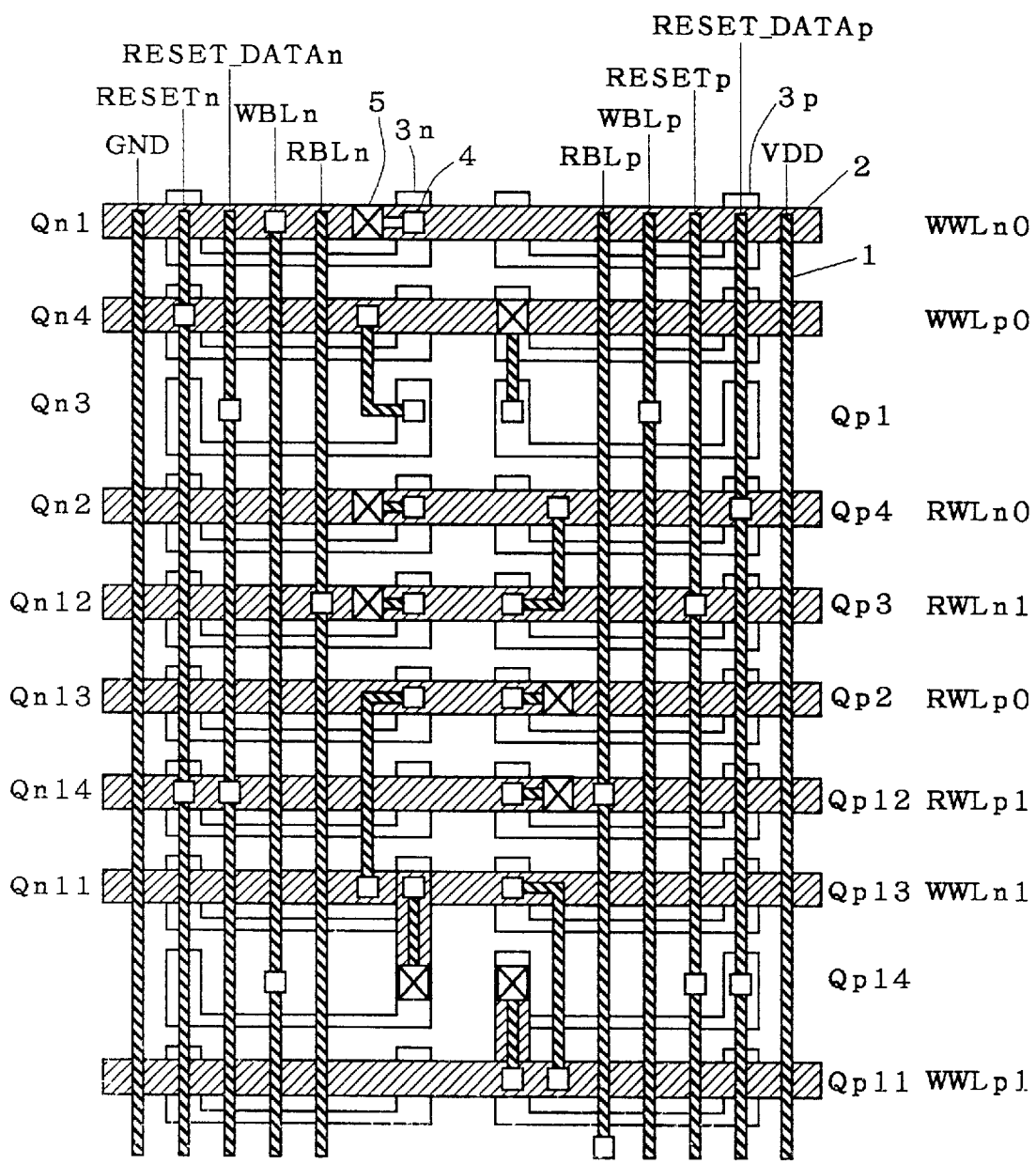
FIG. 14 is a plan view showing a layout pattern of FIG. 13 on a gate array.

FIG. 14 is a plan view showing a layout pattern in which the circuit shown in FIG. 13 is formed by using a gate array for a CMOS transistor. Similarly to the layout pattern according to the first embodiment shown in FIG. 5, an N type diffusion area where transistors are not dielectrically isolated by an oxide film is provided for gate portions 3n that are arranged in a line, and a P type diffusion area where transistors are not dielectrically isolated by an oxide film is provided for gate portions 3p that are arranged in a line, which are omitted in FIG. 14.

From the left of FIG. 14, ten longitudinal first layer wirings 1 are used for a ground potential GND, a reset signal line RESETn, a reset data signal line RESET_DATAn, a write bit line WBLn, a read bit line RBLn, a read bit line RBLp, a write bit line WBLp, a reset signal line RESETp, a reset data signal line RESET_DATAp, and a power source VDD, respectively. Other first layer wirings 1 are used for the connection between first contacts 4, and the like.

From the top of FIG. 14, eight transverse second layer wirings 2 are used for a write word line WWLn0, a write word line WWLp0, a read word line RWLn0, a read word line RWLn1, a read word line RWLp0, a read word line RWLP1, a write word line WWLn1, and a write word line WWLp1, respectively. The first contact 4 is used for the electric connection of the first layer wiring 1 to the gate portions 3 (3n, 3p) or diffusion areas. A second contact 5 is used for the electric connection of the first layer wiring 1 to the second layer wiring 2.

From the gate portion 3n provided on the top of FIG. 14, NMOS transistors Qn1, Qn4, Qn3, Qn2, Qn12, Qn13, Qn14 and Qn11 are sequentially formed. Beginning with the third gate portion 3p from the top of FIG. 14, PMOS transistors Qp1, Qp4, Qp3, Qp2, Qp12, Qp13, Qp14 and Qp11 are sequentially formed.

Thus, a memory cell comprised of the NMOS transistors Qn1 to Qn4 is formed adjacently to a memory cell comprised of the NMOS transistors Qn11 to Qn14. Consequently, a diffusion area can be shared as a source diffusion area between the NMOS transistors Qn2 and Qn12 for reading in the same manner as in the first embodiment. Similarly, a diffusion area can be shared as a source diffusion area between the PMOS transistors Qp2 and Qp12. Accordingly, higher integration can be obtained.

In addition, a memory cell comprised of the NMOS transistors (Qn1 to Qn4, Qn11 to Qn14) and a memory cell comprised of the NMOS transistors (Qp1 to Qp4, Qp11 to Qp14) are formed together. Consequently, the gate array having a CMOS structure can be utilized efficiently.

While an example in which the source is shared by the transistors (Qn2, Qn12, Qp2, Qp12) for reading has been described in the fourth embodiment, the source is shared with the transistors (Qn1, Qn11, Qp1, Qp11) for writing formed adjacently on the same principle so that integration can be enhanced.

<<Fifth Embodiment>>
<First Mode>
<Basic Structure>

Figure 15:
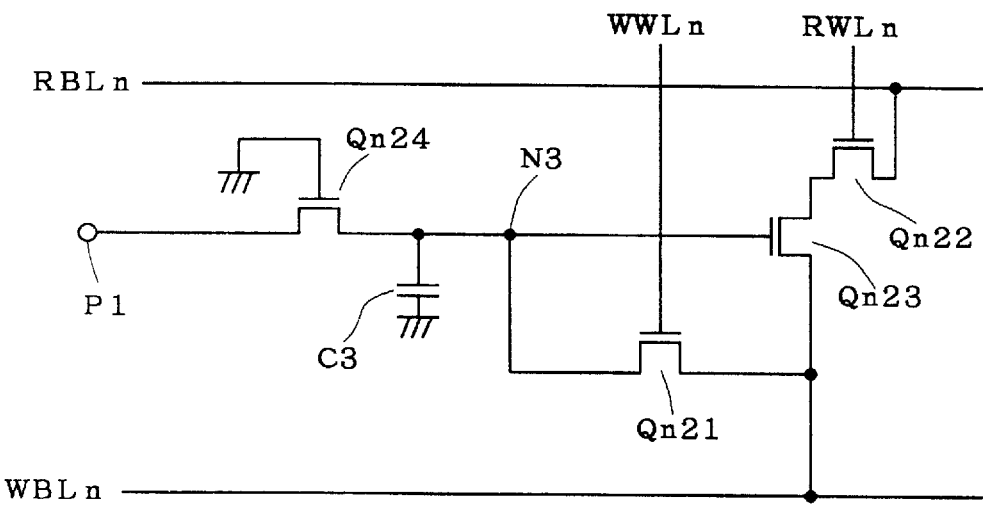
FIG. 15 is a circuit diagram showing the basic structure of a memory according to a first mode of Embodiment 5 in accordance with the present invention.

FIG. 15 is a circuit diagram showing the structure of a dynamic memory cell according to a first mode of a fifth embodiment which is used for a memory contained in a LSI for picture processing.

As shown in FIG. 15, an NMOS transistor Qn21 has a gate connected to a write word line WWLn, a source connected to a write bit line WBLn, and a drain connected to a node N3. An NMOS transistor Qn22 has a gate connected to a read word line RWLn and a source connected to a read bit line RBLn. An NMOS transistor Qn23 has a gate connected to the drain of the NMOS transistor Qn21 through the node N3, a source connected to the write bit line WBLn, and a drain connected to the drain of the NMOS transistor Qn22. An NMOS transistor Qn24 has a gate grounded, a source connected to a terminal P1, and a drain connected to the drain of the NMOS transistor Qn21 and the gate of the NMOS transistor Qn23 through the node N3. The terminal P1 which is in the floating state may be electrically connected to other portions.

A capacitor C3 is shown for convenience, but may be replaced with the drain-gate capacity of the NMOS transistor Qn21, the gate capacity of the NMOS transistor Qn23, the drain-gate capacity of the NMOS transistor Qn23, the source-gate capacity of the NMOS transistor Qn23, and the drain-gate capacity of the NMOS transistor Qn24. More specifically, the NMOS transistors Qn21 to Qn24 form a 1-unit memory cell.

The writing and reading operation for the dynamic memory cell having the above structure according to the first mode of the fifth embodiment will be described below.

According to the structure shown in FIG. 15, when executing the writing operation on the dynamic memory cell formed by the NMOS transistors, only the selected write word line WWLn is set to the H level, the transistor Qn21 for writing is turned on, and the electric potential of the node N3 is defined by the electric potential of the write bit line WBLn. If the electric potential of the write bit line WBLn has the H level, the node N3 has the H level and "1" is written. If the electric potential of the write bit line WBLn has the L level, the node N3 has the L level and "0" is written. The electric potential which is written is kept by setting the selected write word line WWLn to the L level and turning off the transistor Qn21.

When executing the reading operation, the write bit line WBLn is fixed to the L level and the read bit line RBLn is precharged to the H level. The selected read word line RWLn is then set to the H level and the transistor Qn22 for reading is turned on. If "1" is kept, the node N3 has the H level. Since the NMOS transistors Qn22 and Qn23 are turned on and the read bit line RBLn is electrically connected to the ground potential (write bit line WBLn), the electric potential of the read bit line RBLn which is precharged is discharged and read out as the L level ("1").

If "0" is kept, the node N3 has the L level. For this reason, the transistor Qn23 is off so that the read bit line RBLn and the ground potential (the electric potential of the write bit line WBLn) are electrically interrupted. Consequently, the H level of the read bit line RBLn which is precharged is kept. Thus, it is known that the contents of the memory cell are "0".

In this case, the memory cell according to the first mode of the fifth embodiment gives a ground level (a supply voltage having the L level) to the gate of the NMOS transistor Qn24 to keep the NMOS transistor Qn24 off. Consequently, the writing and reading operation can be executed even if the electric potential which should be given to the terminal P1 is set.

<Basic Structure (layout pattern)>

Figure 16:
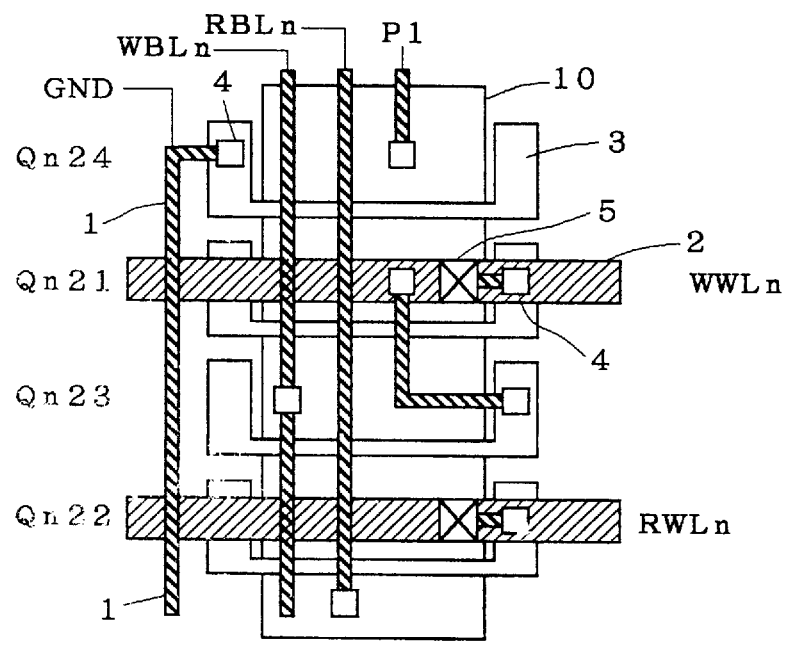
FIG. 16 is a plan view showing a layout pattern of FIG. 15 on a gate array.

FIG. 16 is a plan view showing a layout pattern in which the memory according to the first mode of the fifth embodiment shown in FIG. 15 is formed by using a gate array for gate isolation.

As shown in FIG. 16, a diffusion area 10 in which transistors are not dielectrically isolated by an oxide film is provided for a plurality of (four in FIG. 16) gate portions 3 that are arranged in a line. From the left of FIG. 16, four longitudinal first layer wirings 1 (shown by heavy slash hatching) are used for a ground potential GND, a write bit line WBLn, a read bit line RBLn, and a terminal P1, respectively. Other first layer wirings 1 are used for the connection between first contacts 4, and the like. From the top of FIG. 16, two transverse second layer wirings 2 (shown by fine slash hatching) are used for a write word line WWLn and a read word line RWLn, respectively. The first contact 4 (shown by □) is used for the electric connection of the first layer wiring 1 to the gate portion 3 or diffusion area 10. A second contact 5 (shown by x in □) is used for the electric connection of the first layer wiring 1 to the second layer wiring 2. From the top of FIG. 16, the gates of NMOS transistors are formed in the order of Qn24, Qn21, Qn23 and Qn22.

<Pair Memory Cell Structure (circuit diagram)>

Figure 17:
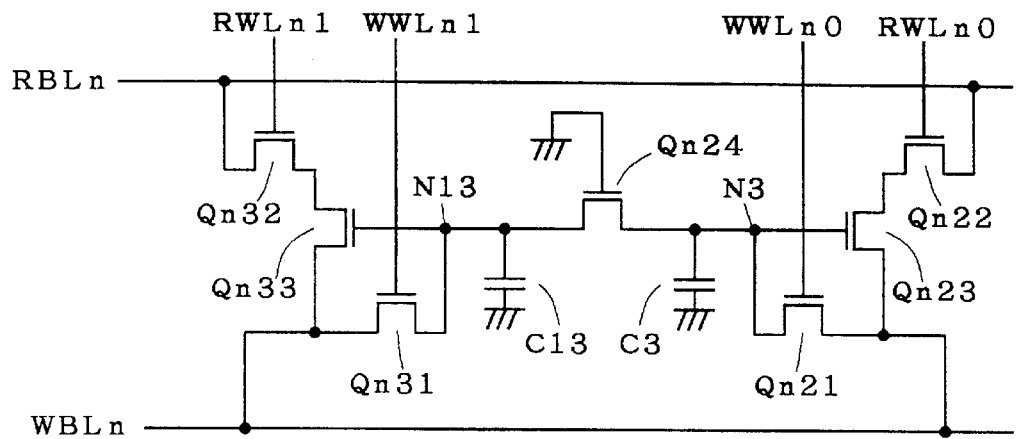
FIG. 17 is a circuit diagram showing the structure of a pair transistor according to the first mode of Embodiment 5.

FIG. 17 is a circuit diagram showing the structure of a pair memory cell in which NMOS transistors form two dynamic memory cells having the structure shown in FIG. 15.

As shown in FIG. 17, an NMOS transistor Qn21 has a gate connected to a write word line WWLn0, a source connected to a write bit line WBLn, and a drain connected to a node N3. An NMOS transistor Qn22 has a gate connected to a read word line RWLn0 and a source connected to a read bit line RBLn. An NMOS transistor Qn23 has a gate connected to the drain of the NMOS transistor Qn21 through the node N3, a source connected to the write bit line WBLn, and a drain connected to the drain of the NMOS transistor Qn22. An NMOS transistor Qn24 has a gate grounded, and a drain connected to the drain of the NMOS transistor Qn21 through the node N3. Thus, the NMOS transistors Qn21 to Qn24 form a 1-unit memory cell.

An NMOS transistor Qn31 has a gate connected to a write word line WWLn1, a source connected to the write bit line WBLn, and a drain connected to the source of the NMOS transistor Qn24 through a node N13. An NMOS transistor Qn32 has a gate connected to a read word line RWLn1 and a source connected to the read bit line RBLn. An NMOS transistor Qn33 has a gate connected to the drain of the NMOS transistor Qn31 through the node N13, a source connected to the write bit line WBLn, and a drain connected to the drain of the NMOS transistor Qn32. Thus, the NMOS transistors Qn31 to Qn33 and Qn24 form a 1-unit memory cell.

According to the pair memory cell shown in FIG. 17, the NMOS transistor Qn24 is shared by two memory cells. For this reason, a transistor can be omitted so that the circuit structure can be simplified. While the NMOS transistors are used in FIG. 17, PMOS transistors may be utilized for the structure.

<Pair Transistor Structure (layout pattern)>

Figure 18:
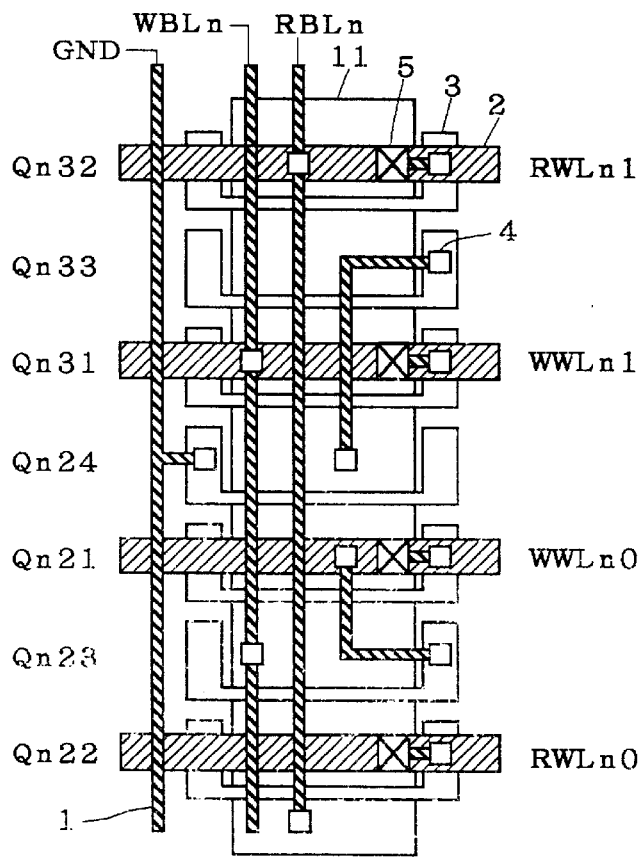
FIG. 18 is a plan view showing a layout pattern of FIG. 17 on a gate array.
Figure 21:
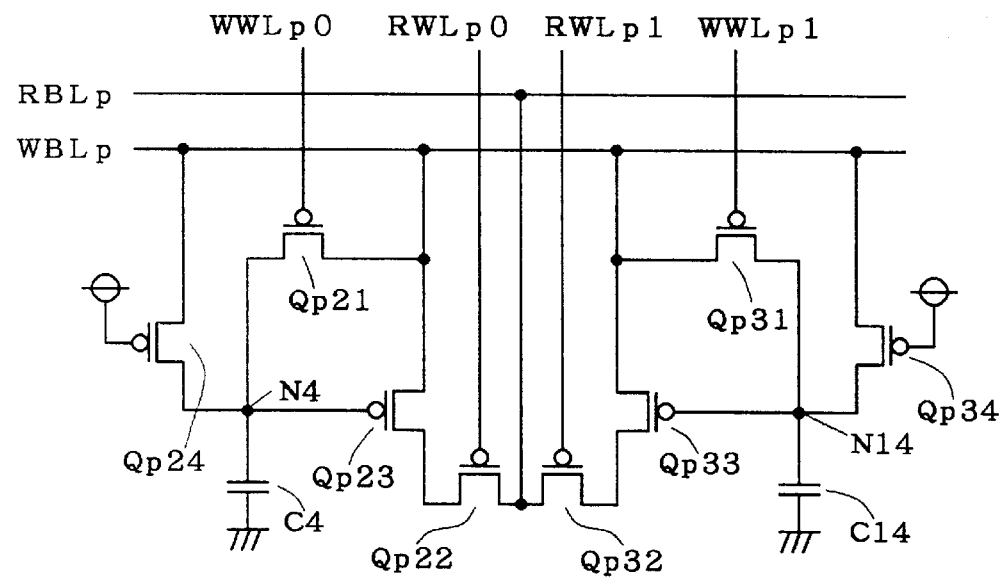
FIG. 21 is a circuit diagram showing the CMOS structure of the memory according to the second mode of Embodiment 5.
Figure 21:
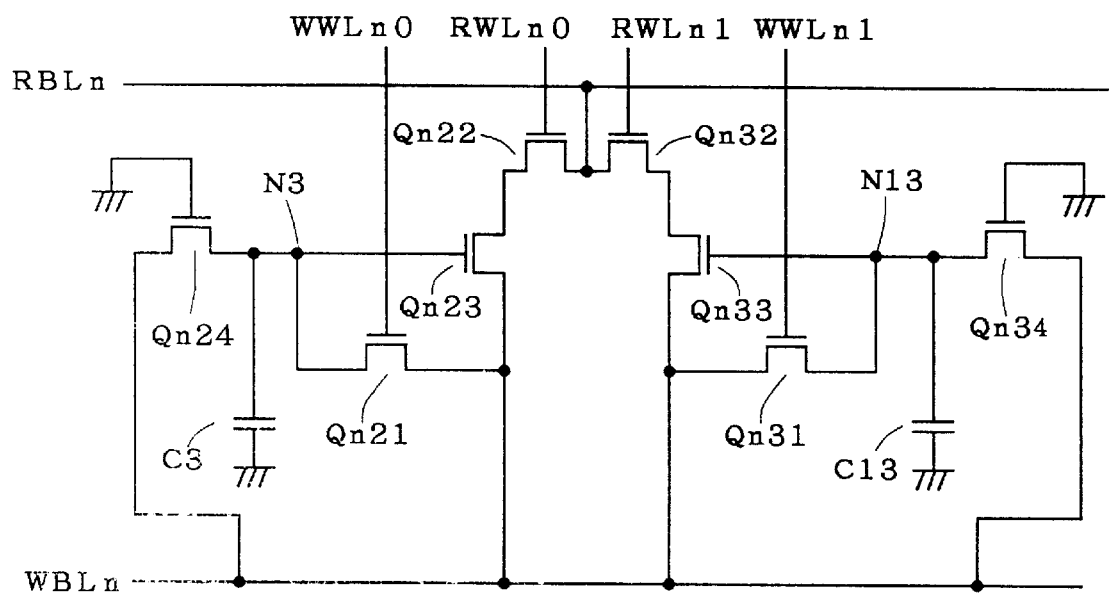

FIG. 18 is a plan view showing a layout pattern in which the circuit shown in FIG. 21 is formed by using a gate array. As shown in FIG. 18, an N type diffusion area 11 in which transistors are not dielectrically isolated by an oxide film is provided for gate portions 3 that are arranged in a line.

From the left of FIG. 18, three longitudinal first layer wirings 1 are used for a ground potential GND, a write bit line WBLn, and a read bit line RBLn, respectively. Other first layer wirings 1 are used for the connection between first contacts 4, and the like. From the top of FIG. 18, four transverse second layer wirings 2 are used for a read word line RWLn1, a write word line WWLn1, a write word line WWLn0, and a read word line RWLn0, respectively. The first contact 4 is used for the electric connection of the first layer wiring 1 to the gate portion 3 or diffusion area 11. A second contact 5 is used for the electric connection of the first layer wiring 1 to the second layer wiring 2.

From the gate portion 3 provided on the top of FIG. 18, NMOS transistors Qn32, Qn33, Qn31, Qn24, Qn21, Qn23 and Qn22 are sequentially formed.

Thus, a memory cell comprised of the NMOS transistors Qn21 to Qn24 is formed adjacently to a memory cell comprised of the NMOS transistors Qn31 to Qn33 and Qn24. Consequently, the NMOS transistor Q24 can be shared by the adjacent memory cells so that higher integration can be obtained.

<Second Mode>
<Basic Structure (circuit diagram)>

Figure 19:
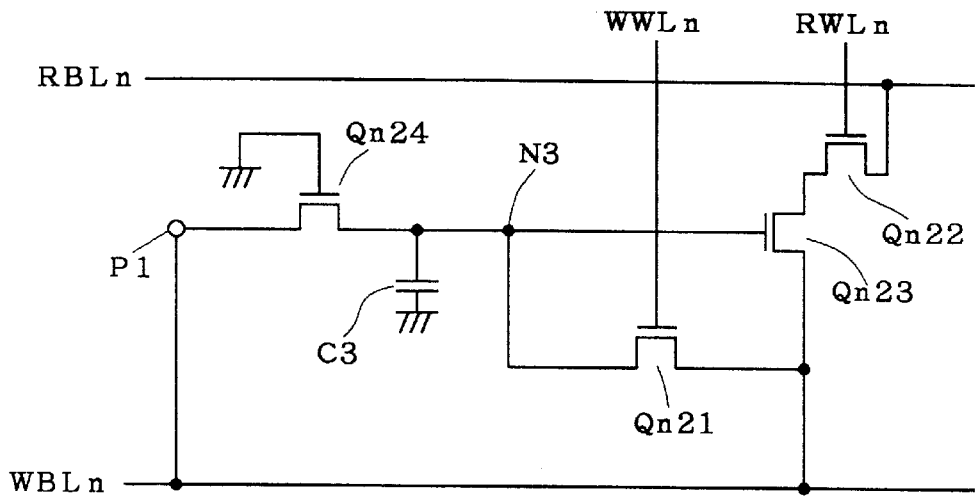
FIG. 19 is a circuit diagram showing the basic structure of a memory according to a second mode of Embodiment 5 in accordance with the present invention.

FIG. 19 is a circuit diagram showing the structure of a dynamic memory cell according to a second mode of the fifth embodiment which is used for a memory contained in a LSI for picture processing.

As shown in FIG. 19, an NMOS transistor Qn24 has a source connected to a write bit line WBLn. Other structures are the same as in the first mode shown in FIG. 15. Therefore, the description will be omitted.

The writing and reading operation for the dynamic memory cell having the above structure according to the second mode of the fifth embodiment is executed in the same manner as in the first mode.

At the time of writing and reading, the memory cell according to the second mode of the fifth embodiment gives a ground level (a supply voltage having the L level) to the gate of the NMOS transistor Qn24 to keep the NMOS transistor Qn24 off. Consequently, the drain of an NMOS transistor Qn21 can be dielectrically isolated from the source of an NMOS transistor Qn23 through the write bit line WBLn without forming an insulating film.

<Basic Structure (layout pattern)>

Figure 20:
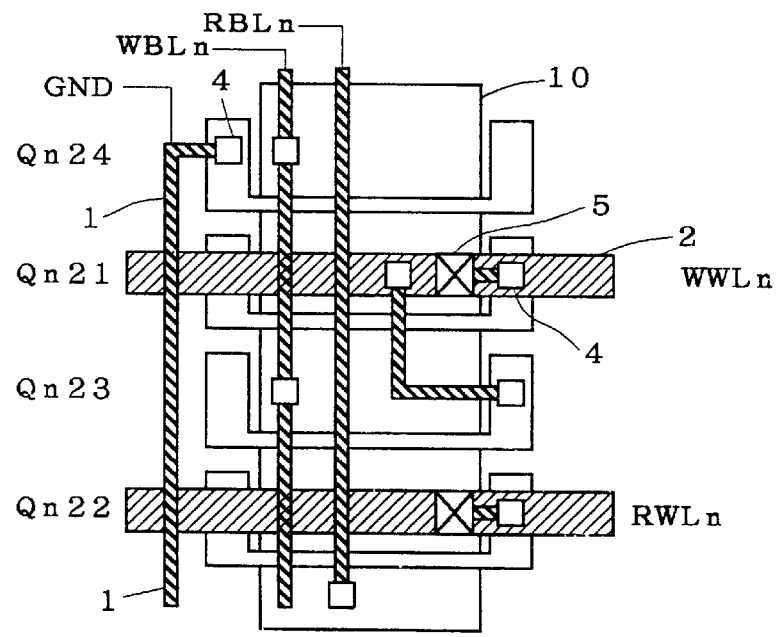
FIG. 20 is a plan view showing a layout pattern of FIG. 19 on a gate array.

FIG. 20 is a plan view showing a layout pattern in which the memory according to the second mode of the fifth embodiment shown in FIG. 19 is formed by using a gate array for gate isolation.

As shown in FIG. 20, a diffusion area 10 in which transistors are not dielectrically isolated by an oxide film is provided for a plurality of (four in FIG. 20) gate portions 3 that are arranged in a line. From the left of FIG. 20, three longitudinal first layer wirings 1 are used for a ground potential GND, a write bit line WBLn, and a read bit line RBLn, respectively. Other first layer wirings 1 are used for the connection between first contacts 4, and the like. From the top of FIG. 20, two transverse second layer wirings 2 are used for a write word line WWLn and a read word line RWLn, respectively. The first contact 4 is used for the electric connection of the first layer wiring 1 to the gate portion 3 or diffusion area 10. A second contact 5 is used for the electric connection of the first layer wiring 1 to the second layer wiring 2. From the top of FIG. 20, the gates of NMOS transistors are formed in the order of Qn24, Qn21, Qn23 and Qn22.

Thus, the drain of the NMOS transistor Qn21 is dielectrically isolated from the source of the NMOS transistor Qn23 through the write bit line WBLn by using the NMOS transistor Qn24 for dielectric isolation, so that high integration can be obtained.

<CMOS Structure (circuit diagram)>

FIG. 21 is a circuit diagram showing the structure of a memory for a CMOS in which NMOS transistors and PMOS transistors each form two dynamic memory cells having the structure shown in FIG. 19.

As shown in FIG. 21, an NMOS transistor Qn21 has a gate connected to a write word line WWLn0, a source connected to a write bit line WBLn, and a drain connected to a node N3. An NMOS transistor Qn22 has a gate connected to a read word line RWLn0 and a source connected to a read bit line RBLn. An NMOS transistor Qn23 has a gate connected to the drain of the NMOS transistor Qn21 through the node N3, a source connected to the write bit line WBLn, and a drain connected to the drain of the NMOS transistor Qn22. An NMOS transistor Qn24 has a gate grounded, a source connected to the write bit line WBLn, and a drain connected to the drain of the NMOS transistor Qn21 through the node N3. Thus, the NMOS transistors Qn21 to Qn24 form a 1-unit memory cell.

An NMOS transistor Qn31 has a gate connected to a write word line WWLn1, a source connected to the write bit line WBLn, and a drain connected to a node N13. An NMOS transistor Qn32 has a gate connected to a read word line RWLn1 and a source connected to the read bit line RBLn. An NMOS transistor Qn33 has a gate connected to the drain of the NMOS transistor Qn31 through the node N13, a source connected to the write bit line WBL, and a drain connected to the drain of the NMOS transistor Qn32. An NMOS transistor Qn34 has a gate grounded, a source connected to the write bit line WBL, and a drain connected to the drain of the NMOS transistor Qn31 through the node N13. Thus, the NMOS transistors Qn31 to Qn34 form a 1-unit memory cell.

A PMOS transistor Qp21 has a gate connected to a write word line WWLp0, a source connected to a write bit line WBLp, and a drain connected to a node N4. A PMOS transistor Qp22 has a gate connected to a read word line RWLp0 and a source connected to a read bit line RBLp. A PMOS transistor Qp23 has a gate connected to the drain of the PMOS transistor Qp21 through the node N4, a source connected to the write bit line WBLp, and a drain connected to the drain of the PMOS transistor Qp22. A PMOS transistor Qp24 has a gate connected to a supply voltage VDD, a source connected to the write bit line WBLp, and a drain connected to the drain of the PMOS transistor Qp21 through the node N4. Thus, the PMOS transistors Qp21 to Qp24 form a 1-unit memory cell.

A PMOS transistor Qp31 has a gate connected to a write word line WWLp1, a source connected to the write bit line WBLp, and a drain connected to a node N14. A PMOS transistor Qp32 has a gate connected to a read word line RWLP1 and a source connected to the read bit line RBLp. A PMOS transistor Qp33 has a gate connected to the drain of the PMOS transistor Qp31 through the node N14, a source connected to the write bit line WBLp, and a drain connected to the drain of the PMOS transistor Qp32. A PMOS transistor Qp34 has a gate connected to a supply voltage VDD, a source connected to the write bit line WBLp, and a drain connected to the drain of the PMOS transistor Qp31 through the node N14. Thus, the PMOS transistors Qp31 to Qp34 form a 1-unit memory cell. In the writing operation for the memory cell formed by the PMOS transistors, the write word line WWLp0 (WWLp1) is selectively set to the L level and the transistor Qp21 (Qp31) for writing is turned on. The subsequent operation is the same as that of the NMOS transistor.

The reading operation for the memory cell formed by the PMOS transistors is executed in the following manner. First of all, the write bit line WBLp is set to the H level and the read bit line RBLp is set to the L level. Then, the selected read word line RWLp0 (RWLP1) is set to the L level and the transistor Qp22 (Qp32) for reading is turned on. If "1" is kept, the node N4 (N14) has the H level. Since the PMOS transistor Qp23 (Qp33) is off, the read bit line RBLp keeps the L level. Thus, it is known that the contents of storage of the memory cell are "1".

If "0" is kept, the node N4 (N14) has the L level. For this reason, the transistors Qp22 (Qp32) and Qp23 (Qp33) are turned on so that the read bit line RBLp and the H level (the write bit line WBLp) are electrically connected to each other. Consequently, the preset L level of the read bit line RBLp is charged and read out as the H level ("0").

<CMOS Structure (layout pattern)>

Figure 22:
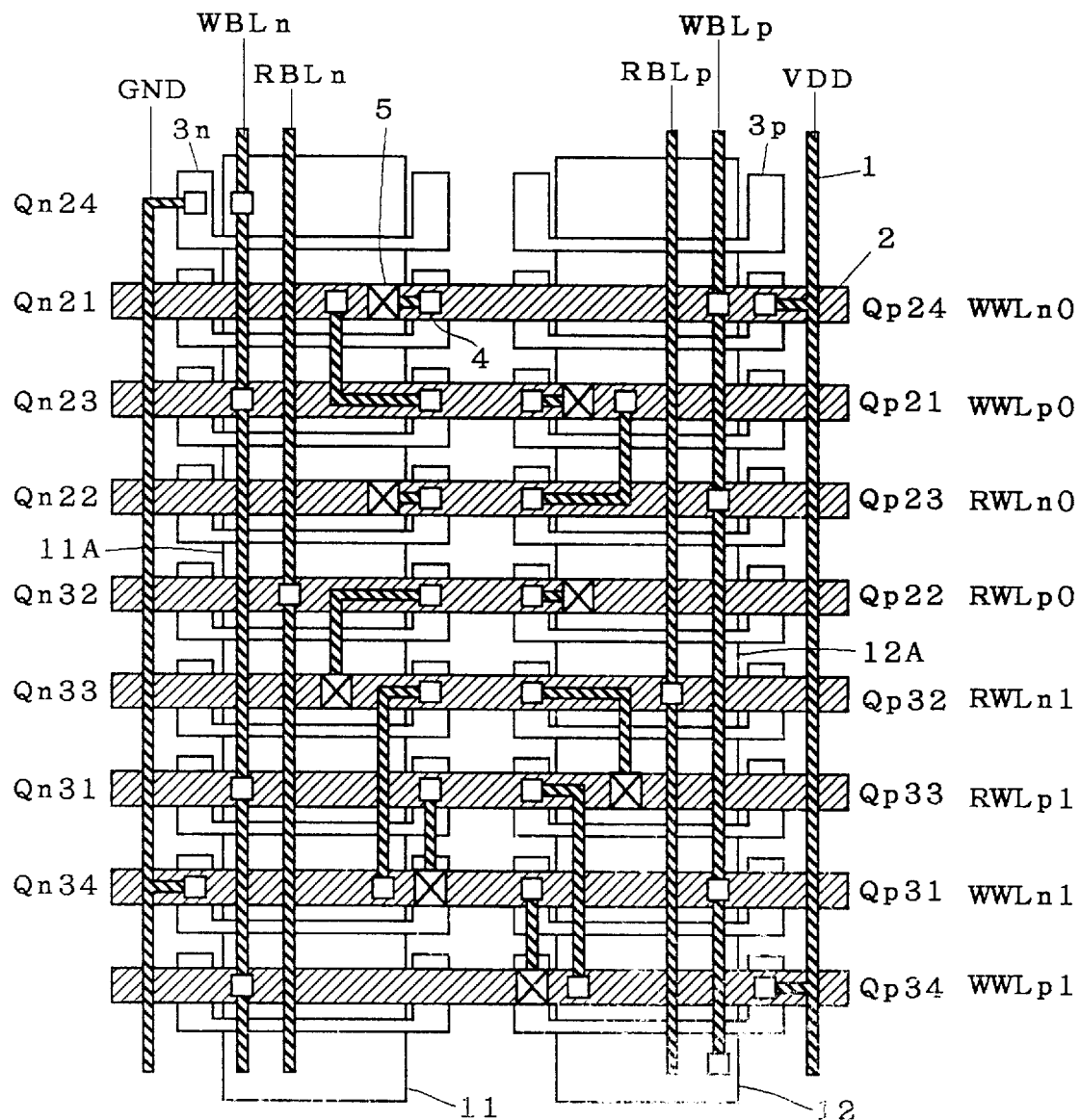
FIG. 22 is a plan view showing a layout pattern of FIG. 21 on a gate array.

FIG. 22 is a plan view showing a layout pattern in which the circuit shown in FIG. 21 is formed by using a gate array for a CMOS transistor. As shown in FIG. 22, an N type diffusion area 11 in which transistors are not dielectrically isolated by an oxide film is provided for gate portions 3n that are arranged in a line, and a P type diffusion area 12 in which transistors are not dielectrically isolated by an oxide film is provided for gate portions 3p that are arranged in a line.

From the left of FIG. 22, six longitudinal first layer wirings 1 are used for a ground potential GND, a write bit line WBLn, a read bit line RBLn, a read bit line RBLp, a write bit line WBLp, and a power source VDD, respectively. Other first layer wirings 1 are used for the connection between first contacts 4, and the like. From the top of FIG. 22, eight transverse second layer wirings 2 are used for a write word line WWLn0, a write word line WWLp0, a read word line RWLn0, a read word line RWLp0, a read word line RWLn1, a read word line RWLP1, a write word line WWLn1, and a write word line WWLp1, respectively. The first contact 4 is used for the electric connection of the first layer wiring 1 to the gate portions 3 (3n, 3p) or diffusion areas 11 and 12. A second contact 5 is used for the electric connection of the first layer wiring 1 to the second layer wiring 2.

From the gate portion 3n provided on the top of FIG. 22, NMOS transistors Qn24, Qn21, Qn23, Qn22, Qn32, Qn33, Qn31 and Qn34 are sequentially formed. Beginning with the second gate portion 3p from the top of FIG. 22, PMOS transistors Qp24, Qp21, Qp23, Qp22, Qp32, Qp33, Qp31 and Qp34 are sequentially formed. Thus, a memory cell comprised of the NMOS transistors Qn21 to Qn24 is formed adjacently to a memory cell comprised of the NMOS transistors Qn31 to Qn34. Consequently, a diffusion area 11A can be shared as a source diffusion area between the NMOS transistor Qn22 which connects the read word line RWLn0 to the gate and the NMOS transistor Qn32 which connects the read word line RWLn1 to the gate. Similarly, a diffusion area 12A can be shared as a source diffusion area between the PMOS transistors Qp22 and Qp32 for reading. Accordingly, higher integration can be obtained.

In addition, a memory cell comprised of the NMOS transistors (Qn21 to Qn24, Qn31 to Qn34) and a memory cell comprised of the PMOS transistors (Qp21 to Qp24, Qp31 to Qp34) are formed together. Consequently, the gate array having a CMOS structure can be utilized efficiently.

While an example in which the source is shared by the transistors (Qn22, Qn32, Qp22, Qp32) for reading has been described in the second mode of the fifth embodiment, the source is shared with the transistors (Qn21, Qn31, Qp21, Qp31) for writing formed adjacently on the same principle so that integration can be enhanced.

<<Sixth Embodiment>>
<First Mode>
<Basic Structure (circuit diagram)>

Figure 23:
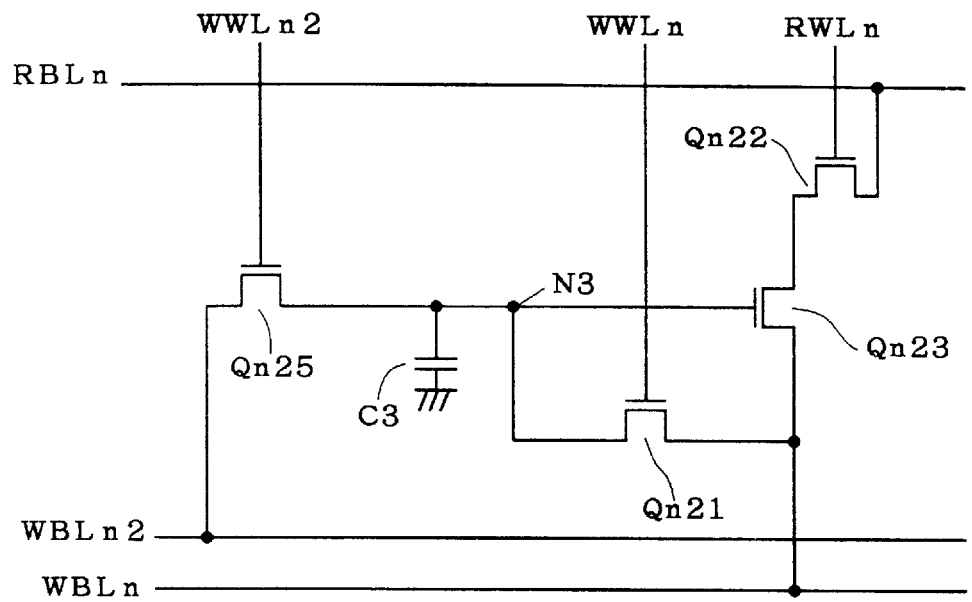
FIG. 23 is a circuit diagram showing the basic structure of a memory according to a first mode of Embodiment 6 in accordance with the present invention.

FIG. 23 is a circuit diagram showing the structure of a dynamic memory cell according to a first mode of a sixth embodiment which is used for a memory contained in a LSI for picture processing.

As shown in FIG. 23, an NMOS transistor Qn21 has a gate connected to a write word line WWLn, a source connected to a write bit line WBLn, and a drain connected to a node N3. An NMOS transistor Qn22 has a gate connected to a read word line RWLn and a source connected to a read bit line RBLn. An NMOS transistor Qn23 has a gate connected to the drain of the NMOS transistor Qn21 through the node N3, a source connected to the write bit line WBLn, and a drain connected to the drain of the NMOS transistor Qn22. An NMOS transistor Qn25 has a gate connected to a write word line WWLn2, a source connected to a write bit line WBLn2, and a drain connected to the drain of the NMOS transistor Qn21 through the node N3.

A capacitor C3 is shown for convenience, but may be replaced with the drain-gate capacity of the NMOS transistor Qn21, the gate capacity of the NMOS transistor Qn23, the drain-gate capacity of the NMOS transistor Qn23, the source-gate capacity of the NMOS transistor Qn23, and the drain-gate capacity of the NMOS transistor Qn25. More specifically, the NMOS transistors Qn21, Qn22, Qn23 and Qn25 form a 1-unit memory cell.

The writing and reading operation for the dynamic memory cell having the above structure according to the first mode of the sixth embodiment will be described below.

According to the structure shown in FIG. 23, when executing the writing operation on the dynamic memory cell formed by the NMOS transistors, the memory cell is selected by either of the write word lines WWLn and WWLn2.

Selection is performed by the write word line WWLn in the following manner. First of all, only the selected write word line WWLn is set to the H level (all write word lines WWLn2 have the L level), the transistor Qn21 for writing is turned on, and the electric potential of the node N3 is defined by the electric potential of the write bit line WBLn. If the electric potential of the write bit line WBLn has the H level, the node N3 has the H level and "1" is written. If the electric potential of the write bit line WBLn has the L level, the node N3 has the L level and "0" is written. The electric potential which is written is kept by setting the selected write word line WWLn to the L level and turning off the transistor Qn21.

Selection is performed by the write word line WWLn2 in the following manner. First of all, only the selected write word line WWLn2 is set to the H level (all write word lines WWLn have the L level), the transistor Qn25 for writing is turned on, and the electric potential of the node N3 is defined by the electric potential of the write bit line WBLn2. If the electric potential of the write bit line WBLn2 has the H level, the node N3 has the H level and "1" is written. If the electric potential of the write bit line WBLn2 has the L level, the node N3 has the L level and "0" is written. The electric potential which is written is kept by setting the selected write word line WWLn2 to the L level and turning off the transistor Qn25.

Thus, the first writing operation in which the NMOS transistor Qn21 for first writing is turned on/off by using the write bit line WBLn and the write word line WWLn and the second writing operation in which the NMOS transistor Qn25 for second writing is turned on/off by using the write bit line WBLn2 and the write word line WWLn2 can be executed independently for the storage node N3.

When executing the reading operation, the write bit line WBLn is fixed to the L level, and the read bit line RBLn is precharged to the H level. The selected read word line RWLn is then set to the H level and the transistor Qn22 for reading is turned on. If "1" is kept, the node N3 has the H level. Since the NMOS transistors Qn22 and Qn23 are turned on, the electric potential of the read bit line RBLn which is precharged is discharged and read out as the L level ("1").

If "0" is kept, the node N3 has the L level. For this reason, the transistor Qn23 is off so that the read bit line RBLn and a ground potential (the electric potential of the write bit line WBLn) are electrically interrupted. Consequently, the H level of the read bit line which is precharged is kept. Thus, it is known that the contents of the memory cell are "0".

<Basic Structure (layout pattern)>

Figure 24:
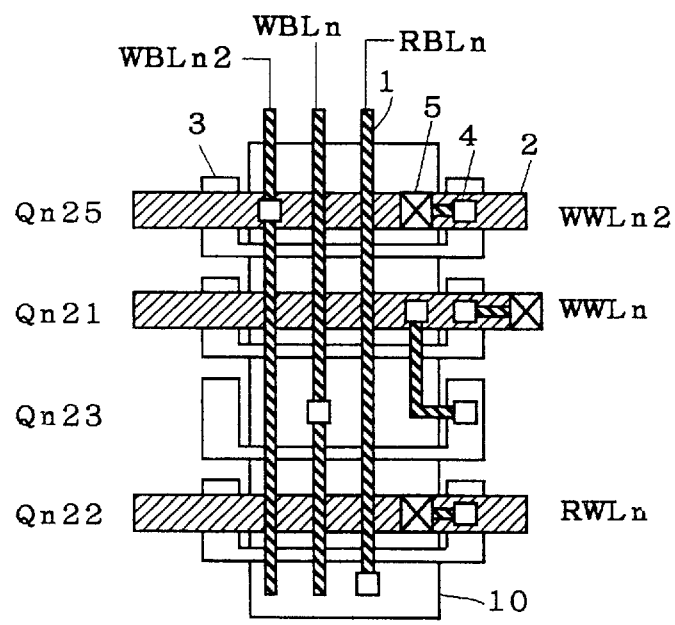
FIG. 24 is a plan view showing a layout pattern of FIG. 23 on a gate array.

FIG. 24 is a plan view showing a layout pattern in which the memory according to the first mode of the sixth embodiment shown in FIG. 23 is formed by using a gate array for gate isolation.

As shown in FIG. 24, a diffusion area 10 in which transistors are not dielectrically isolated by an oxide film is provided for a plurality of (four in FIG. 24) gate portions 3 that are arranged in a line. From the left of FIG. 24, three longitudinal first layer wirings 1 (shown by heavy slash hatching) are used for a write bit line WBLn2, a write bit line WBLn, and a read bit line RBLn, respectively. Other first layer wirings 1 are used for the connection between first contacts 4, and the like. From the top of FIG. 24, three transverse second layer wirings 2 (shown by fine slash hatching) are used for a write word line WWLn2, a write word line WWLn, and a read word line RWLn, respectively. The first contact 4 (shown by □) is used for the electric connection of the first layer wiring 1 to the gate portion 3 or diffusion area 10. A second contact 5 (shown by x □) is used for the electric connection of the first layer wiring 1 to the second layer wiring 2. From the top of FIG. 24, the gates of NMOS transistors are formed in the order of Qn25, Qn21, Qn23 and Qn22.

<Second Mode>
<Basic Structure (circuit diagram)>

Figure 25:
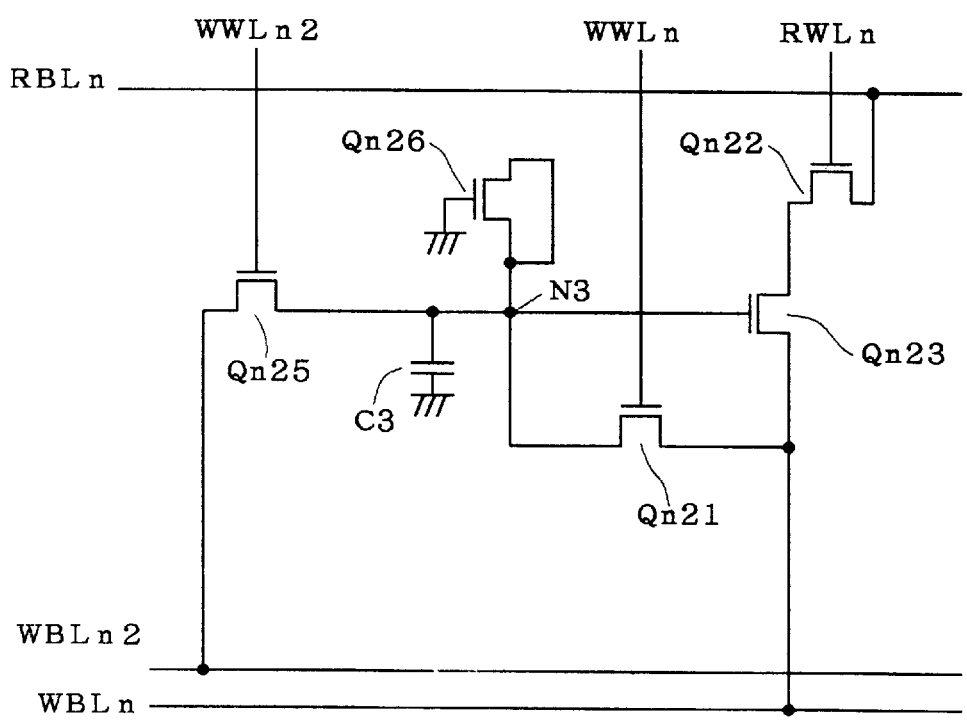
FIG. 25 is a circuit diagram showing the basic structure of a memory according to a second mode of Embodiment 6 in accordance with the present invention.

FIG. 25 is a circuit diagram showing the structure of a dynamic memory cell according to a second mode of the sixth embodiment which is used for a memory contained in a LSI for picture processing.

As shown in FIG. 25, an NMOS transistor Qn26 has a gate grounded, and a source and a drain connected to a node N3. Other structures are the same as that of the first mode of the sixth embodiment shown in FIG. 23.

The writing and reading operation for the dynamic memory cell having the above structure according to the second mode of the sixth embodiment is executed in the same manner as in the first mode of the sixth embodiment.

In comparison with the first mode, the capacity of the capacitor C3 according to the second mode can exceed that of the capacitor C3 according to the first mode by the drain-gate and source-gate capacities of the NMOS transistor Qn26. Consequently, the capacity of storage of the memory cell can be increased.

<CMOS Structure (circuit diagram)>

Figure 26:
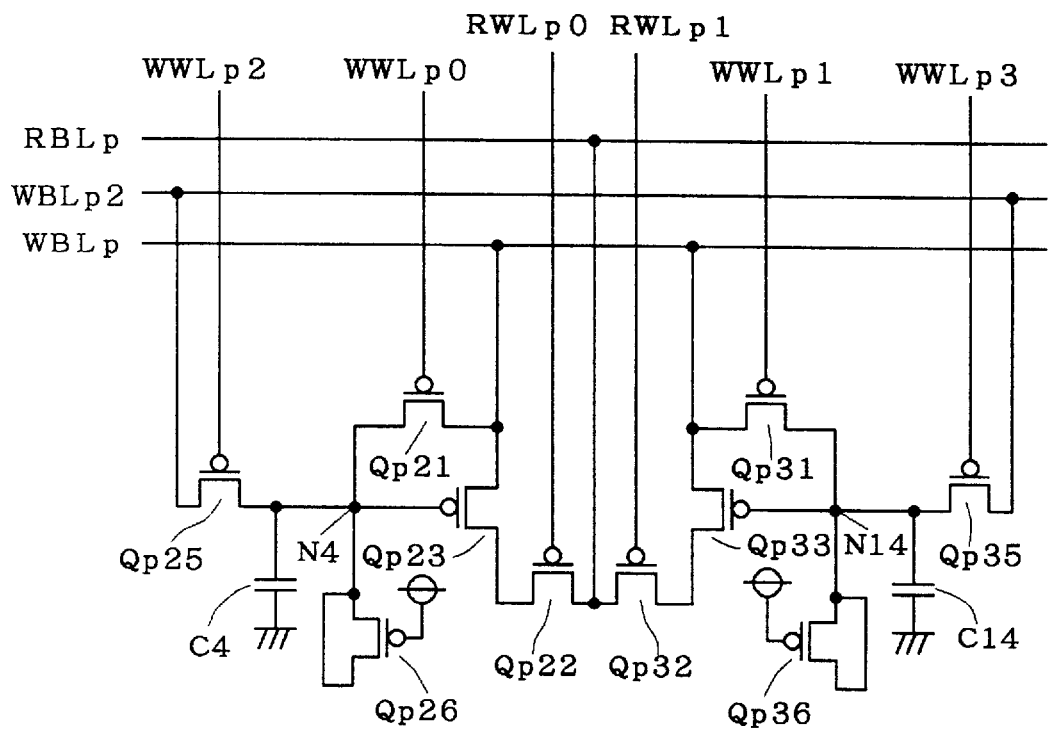
FIG. 26 is a circuit diagram showing the CMOS structure of the memory according to the second mode of Embodiment 6.
Figure 26:
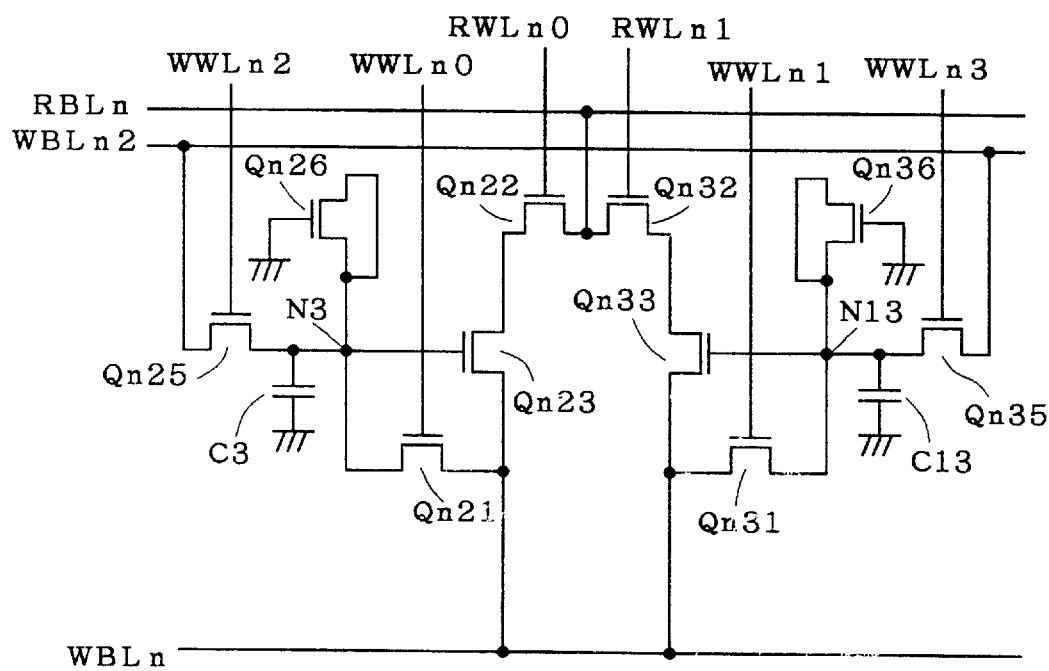

FIG. 26 is a circuit diagram showing the structure of a memory for a CMOS in which NMOS transistors and PMOS transistors each form two dynamic memory cells having the structure shown in FIG. 25.

As shown in FIG. 26, an NMOS transistor Qn26 has a gate grounded, and a source and a drain connected to a node N3. Thus, NMOS transistors Qn21 to Qn23 and Qn25 to Qn26 form a 1-unit memory cell.

An NMOS transistor Qn36 has a gate grounded, and a source and a drain connected to the drain of an NMOS transistor Qn31 and a node N13. Thus, NMOS transistors Qn31 to Qn33 and Qn35 to Qn36 form a 1-unit memory cell.

A PMOS transistor Qp26 has a gate connected to a power source VDD, and a source and a drain connected to the drain of a PMOS transistor Qp21 and a node N4. Thus, PMOS transistors Qp21 to Qp23 and Qp25 to Qp26 form a 1-unit memory cell.

A PMOS transistor Qp36 has a gate connected to a power source VDD, and a source and a drain connected to the drain of a PMOS transistor Qp31 and a node N14. Thus, PMOS transistors Qp31 to Qp33 and Qp35 to Qp36 form a 1-unit memory cell. Other structures are basically the same as that of the first mode according to the sixth embodiment shown in FIG. 23.

<CMOS Structure (layout pattern)>

Figure 27:
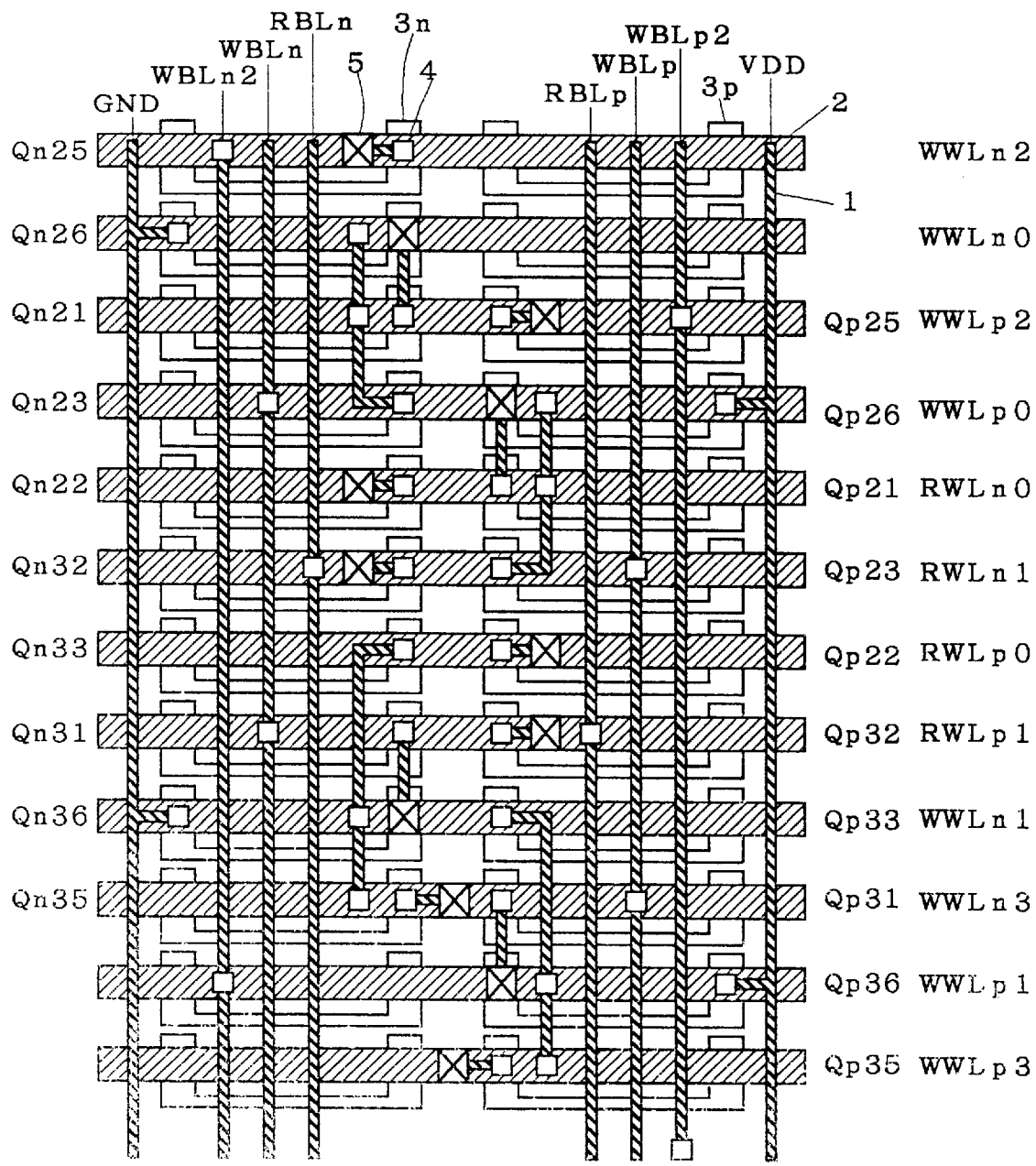
FIG. 27 is a plan view showing a layout pattern of FIG. 26 on a gate array.
Figure 28:
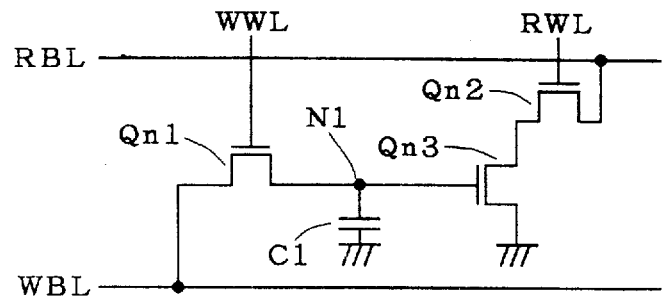
FIG. 28 is a circuit diagram showing the basic structure of a memory according to the prior art.

FIG. 27 is a plan view showing a layout pattern in which the circuit shown in FIG. 26 is formed by using a gate array for a CMOS transistor. Similarly to the layout pattern according to the fifth embodiment shown in FIG. 22, an N type diffusion area where transistors are not dielectrically isolated by an oxide film is provided for gate portions 3n that are arranged in a line, and a P type diffusion area where transistors are not dielectrically isolated by an oxide film is provided for gate portions 3p that are arranged in a line, which are not shown in FIG. 27. From the left of FIG. 27, eight longitudinal first layer wirings 1 are used for a ground potential GND, a write bit line WBLn2, a write bit line WBLn, a read bit line RBLn, a read bit line RBLp, a write bit line WBLp, a write bit line WBLp2, and a power source VDD, respectively. Other first layer wirings 1 are used for the connection between first contacts 4, and the like.

From the top of FIG. 27, twelve transverse second layer wirings 2 are used for a write word line WWLn2, a write word line WWLn0, a write word line WWLp2, a write word line WWLp0, a read word line RWLn0, a read word line RWLn1, a read word line RWLp0, a read word line RWLP1, a write word line WWLn1, a write word line WWLn3, a write word line WWLp1, and a write word line WWLp3, respectively. The first contact 4 is used for the electric connection of the first layer wiring 1 to the gate portions 3 (3n, 3p) or diffusion areas. A second contact 5 is used for the electric connection of the first layer wiring 1 to the second layer wiring 2.

From the gate portion 3n provided on the top of FIG. 27, NMOS transistors Qn25, Qn26, Qn21, Qn23, Qn22, Qn32, Qn33, Qn31, Qn36 and Qn35 are sequentially formed. Beginning with the third gate portion 3p from the top of FIG. 27, PMOS transistors Qp25, Qp26, Qp21, Qp23, Qp22, Qp32, Qp33, Qp31, Qp36 and Qp35 are sequentially formed.

Thus, a memory cell comprised of the NMOS transistors Qn21 to Qn23 and Qn25 to Qn26 is formed adjacently to a memory cell comprised of the NMOS transistors Qn31 to Qn33 and Qn35 to Qn36. Consequently, a diffusion area can be shared as a source diffusion area between the NMOS transistors Qn22 and Qn32 for reading. Similarly, a diffusion area can be shared as a source diffusion area between the PMOS transistors Qp22 and Qp32 for reading. Thus, higher integration can be obtained.

In addition, a memory cell comprised of the NMOS transistors (Qn21 to Qn23, Qn25 to Qn26, Qn31 to Qn33, Qn35 to Qn36) and a memory cell comprised of the PMOS transistors (Qp21 to Qp23, Qp25 to Qp26, Qp31 to Qp33, Qp35 to Qp36) are formed together. Consequently, the gate array having a CMOS structure can be utilized efficiently.

While an example in which the source is shared by the transistors (Qn22, Qn32, Qp22, Qp32) for reading has been described in the second mode of the sixth embodiment, the source is shared with the transistors (Qn25, Qn35, Qp25, Qp35) for second writing formed adjacently on the same principle so that integration can be enhanced.

While the invention has been described in detail, the foregoing description is in all aspects illustrative and not restrictive. It is understood that numerous other modifications and variations can be devised without departing from the scope of the invention.

We claim:

1. A semiconductor memory comprising:
    a write word line;
    a write bit line;
    a read word line;
    a read bit line;
    a first transistor of a predetermined conductivity type having a control electrode connected to said write word line, a first electrode connected to said write bit line and a second electrode;
    a second transistor of the predetermined conductivity type having a control electrode connected to said read word line, a first electrode connected to said read bit line and a second electrode;
    a third transistor of the predetermined conductivity type having a control electrode connected to the second electrode of said first transistor, a first electrode for receiving a first control voltage, and a second electrode connected to the second electrode of said second transistor; and
    a fourth transistor of the predetermined conductivity type having a control electrode for receiving a second control voltage, a first electrode connected to the first electrode of said third transistor without connecting a fixed potential, and a second electrode connected to the second electrode of said first transistor without connecting a fixed potential,
    wherein said second control voltage includes having the level at which said fourth transistor is turned off,
    wherein said first to fourth transistors form a memory cell in which the control electrode of said third transistor is defined as a storage node and said first transistor and said third transistor are not separated by an insulating film, and
    wherein an operational state of said fourth transistor controls whether said second electrode of said transistor is dielectrically isolated from said first electrode of said third transistor.

2. The semiconductor memory according to claim 1, wherein said first and second control voltages are supply voltages obtained from predetermined power sources.

3. The semiconductor memory according to claim 1, further comprising;
    a fifth transistor of the predetermined conductivity type having a control electrode for receiving a third control voltage, and first and second electrodes connected to said storage node of said memory cell,
    wherein said third control voltage includes a voltage having the level at which said fifth transistor is turned off, and
    wherein said first to fourth and fifth transistors form said memory cell.

4. The semiconductor memory according to claim 3, wherein said first to third control voltages are supply voltages obtained from predetermined power sources.

5. The semiconductor memory according to claim 1, wherein said second control voltage includes a first voltage having the level at which said fourth transistor is turned off, and a second voltage having the level at which said fourth transistor is turned on.

6. The semiconductor memory according to claim 5, wherein said first control voltage includes a first indicating voltage for indicating data "0" and a second indicating voltage for indicating data "1".

7. A semiconductor memory comprising:

a write word line;

a write bit line;

a read word line;

a read bit line;

a first transistor of a predetermined conductivity type having a control electrode connected to said write word line, a first electrode connected to said write bit line and a second electrode;

a second transistor of the predetermined conductivity type having a control electrode connected to said read word line, a first electrode connected to said read bit line and a second electrode;

a third transistor of the predetermined conductivity type having a control electrode connected to the second electrode of said first transistor, a first electrode for receiving a first control voltage, and a second electrode connected to the second electrode of said second transistor;

a fourth transistor of the predetermined conductivity type having a control electrode for receiving a second control voltage, a first electrode connected to the first electrode of said third transistor, and a second electrode connected to the second electrode of said first transistor;

a second write word line and a second write bit line, wherein said second control voltage includes a voltage having the level at which said fourth transistor is turned off, and wherein said first to fourth transistors form a memory cell in which the control electrode of said third transistor is defined as a storage node, wherein said second control voltage includes a first voltage having the level at which said fourth transistor is turned off, and a second voltage having the level at which said fourth transistor is turned on, wherein said first control voltage includes a first indicating voltage for indicating data "0" and a second indicating voltage for indicating data "1".

wherein said first control voltage is supplied from said second write bit line, and wherein said second control voltage is supplied from said second write word line.

8. A semiconductor memory comprising;

first and second memory cells which include said memory cell of said semiconductor memory according to claim 1 respectively, wherein said first memory cell is formed by an N type transistor of a basic cell of said CMOS gate array, and said second memory cell is formed by a P type transistor of said basic cell of said CMOS gate array.

9. A semiconductor memory comprising;

a write word line, a write bit line, a read word line, a read bit line, a first transistor of a predetermined conductivity type having a control electrode connected to said write word line, a first electrode connected to said write bit line and a second electrode, a second transistor of the predetermined conductivity type having a control electrode connected to said read word line, a first electrode connected to said read bit line and a second electrode, a third transistor of the predetermined conductivity type having a control electrode connected to the second electrode of said first transistor, a first electrode connected to said write bit line, and a second electrode connected to the second electrode of said second transistor, and a fourth transistor of the predetermined conductivity type having a control electrode for receiving a control voltage, a first electrode connected to the second electrode of said first transistor and a second electrode, wherein said control voltage includes a voltage having the level at which said fourth transistor is turned off, and wherein said first to fourth transistors form a memory cell in which the control electrode of said third transistor is defined as a storage node.

10. The semiconductor memory according to claim 9, wherein said control voltage is a supply voltage obtained from a predetermined power source.

11. A semiconductor memory comprising;

first and second semiconductor storage portions which include said memory cell of said semiconductor memory according to claim 9 respectively, wherein said fourth transistor is shared by said first and second semiconductor storage portions.

12. A semiconductor memory comprising;

first and second memory cells which include said memory cell of said semiconductor memory according to claim 9 respectively, wherein said first memory cell is formed by an N type transistor of a basic cell of a CMOS gate array, and said second memory cell is formed by a P type transistor of said basic cell of a CMOS gate array.

13. A semiconductor memory including a dynamic random access memory cell, comprising:

a write word line, a write bit line, a read word line, a read bit line;

a first MOS transistor of a predetermined conductivity type having a control electrode connected to said write word line, a first electrode connected to said write bit line and a second electrode;

a second MOS transistor of the predetermined conductivity type having a control electrode connected to said read word line, a first electrode connected to said read bit line and a second electrode;

a third MOS transistor of the predetermined conductivity type having a control electrode connected to the second electrode of said first MOS transistor, a first electrode for receiving a first control voltage, and a second electrode connected to the second electrode of said second MOS transistor;

a fourth MOS transistor of the predetermined conductivity type having a control electrode for receiving a second control voltage, a first electrode connected to the first electrode of said third MOS transistor without connecting a fixed potential, and a second electrode connected to the second electrode of said first MOS transistor without connecting a fixed potential, wherein said second control voltage includes a voltage having a level at which said fourth MOS transistor is turned off, wherein said first to fourth MOS transistors form a memory cell in which the control electrode of said third MOS transistor is defined as a storage node and said first MOS transistor and said third MOS transistor are not separated by an insulating film, and wherein an operational state of said fourth MOS transistor controls whether said second electrode of said first MOS transistor is dielectrically isolated from said first electrode of said third MOS transistor.

14. A semiconductor memory including DRAM (dynamic random access memory) memory cell composed of first to fourth transistors of a predetermined conductivity type, comprising;

a write word line, a write bit line, a read word line, and a read bit line, wherein said first transistor has a control electrode connected to said write word line, a first electrode connected to said write bit line and a second electrode, wherein said second transistor has a control electrode connected to said read word line, a first electrode connected to said read bit line and a second electrode, wherein said third transistor has a control electrode connected to the second electrode of said first transistor, a first electrode connected to said write bit line, and a second electrode connected to the second electrode of said second transistor, wherein said fourth transistor has a control electrode for receiving a control voltage, a first electrode connected to the second electrode of said first transistor and a second electrode, wherein said control voltage includes a voltage having the level at which said fourth transistor is turned off, and wherein said first to fourth transistors form said DRAM memory cell in which the control electrode of said third transistor is defined as a storage node.

15. A semiconductor memory according to claim 1, further comprising a CMOS gate array comprising:

said memory cell, wherein said first transistor, said second transistor, said third transistor, and said fourth transistor comprise n-type transistors; and another memory cell comprising a first p-type transistor, a second p-type transistor, a third p-type transistor and a fourth p-type transistor.

* * * * *

UNITED STATES PATENT AND TRADEMARK OFFICE
CERTIFICATE OF CORRECTION

PATENT NO. : 5,841,690
DATED : November 24, 1998
INVENTOR(S) : Koji Shibutani, et. al.

It is certified that error appears in the above-indentified patent and that said Letters Patent is hereby corrected as shown below:

Title page, item [54] and col. 1, the title should read:
--TRANSISTOR-BASED SEMICONDUCTOR MEMORY--

Signed and Sealed this

Nineteenth Day of October, 1999

Attest:

Q. TODD DICKINSON

Attesting Officer

Acting Commissioner of Patents and Trademarks